US009885737B2

(12) United States Patent
Adams et al.

(10) Patent No.: US 9,885,737 B2
(45) Date of Patent: Feb. 6, 2018

(54) QUICK CHANGE SMALL FOOTPRINT TESTING SYSTEM AND METHOD OF USE

(71) Applicant: Modus Test Automation, LLC, Rockwall, TX (US)

(72) Inventors: Lynwood Adams, Rockwall, TX (US); Jack Lewis, Royse City, TX (US)

(73) Assignee: Modus Test Automation, LLC, Richardson, TX (US)

( * ) Notice: Subject to any disclaimer, the term of this patent is extended or adjusted under 35 U.S.C. 154(b) by 196 days.

(21) Appl. No.: 14/996,045

(22) Filed: Jan. 14, 2016

(65) Prior Publication Data

US 2016/0209443 A1 Jul. 21, 2016

Related U.S. Application Data

(60) Provisional application No. 62/104,117, filed on Jan. 16, 2015.

(51) Int. Cl.
*G01R 31/00* (2006.01)
*G01R 1/073* (2006.01)
*G01R 31/28* (2006.01)
*G01R 1/04* (2006.01)

(52) U.S. Cl.
CPC ....... *G01R 1/07328* (2013.01); *G01R 1/0466* (2013.01); *G01R 1/07314* (2013.01); *G01R 31/2879* (2013.01); *G01R 31/2886* (2013.01); *G01R 31/2889* (2013.01); *G01R 31/2896* (2013.01)

(58) Field of Classification Search
CPC .............. G01R 1/0466; G01R 1/07314; G01R 31/2879; G01R 31/2886; G01R 31/2889; G01R 31/2896
USPC .... 324/71, 378, 403, 415, 425, 500, 756.01, 324/756.02
See application file for complete search history.

(56) References Cited

U.S. PATENT DOCUMENTS

2007/0229102 A1* 10/2007 Eldridge ............ G01R 31/2889
324/756.03
2010/0134134 A1* 6/2010 Grover ............... G01R 31/2889
324/750.3
2013/0135002 A1* 5/2013 Grover ............... G01R 31/2889
324/756.02

* cited by examiner

*Primary Examiner* — Jermele M Hollington
*Assistant Examiner* — Raul Rios Russo
(74) *Attorney, Agent, or Firm* — Christopher A. Proskey; BrownWinick Law Firm

(57) ABSTRACT

A testing system for semiconductor chips having a removable device under test printed circuit board (DUT PCB) that electrically connects with the electrical testing components of the system. A removable top plate is placed on top of the DUT PCB and is locked in place by a plurality of locking posts that selectively connect to cam surfaces in the top plate that pull the top plate down sandwiching the DUT PCB between the top plate and the electrical testing components of the system. The DUT PCB is quickly and easily removed and replaced by moving the locking posts between an engaged position and a disengaged position. In this way, a single testing system can be used to test a great variety of semiconductor chips thereby reducing capital equipment costs and space needed in cleanrooms.

20 Claims, 24 Drawing Sheets

QUICK CHANGE SMALL FOOTPRINT TESTING SYSTEM AND METHOD OF USE

FIELD OF THE INVENTION

This invention relates to a testing system. More specifically and without limitation, this invention relates to a testing system for semiconductor chips, and related method of use.

BACKGROUND OF THE INVENTION

Along with the development of semiconductor chips, a need developed to test these semiconductor chips to ensure that they are manufactured within specified tolerances and function properly. Many manufacturers of semiconductor chips such as Intel®, AMD®, Xilinx®, Texas Instruments®, NVIDIA®, Qualcomm® among countless others manufacture semiconductor chips which are then tested by a chip testing system having a device under test printed circuit board (DUT PCB) with a testing socket that is attached thereto. The DUT PCB and testing sockets are generally custom made to fit each specific semiconductor chip, making them quite expensive.

Manufacturers tend to simultaneously manufacture a variety of semiconductor chips within their facilities so as to maximize their overhead and equipment utilization rates. Due to these multiple product lines, manufacturers have a need to test a variety of semiconductor chips at the same time, each type of chip requiring a special testing socket. Since cleanroom space is extremely limited it is undesirable to have a dedicated testing machine for each type of semiconductor chip. In addition, having a dedicated testing machine for each type of chip is extremely expensive. However, conventional testing systems are not capable of testing a plurality of semiconductor chips, nor are conventional testing systems easily converted between configurations for testing different semiconductor chips.

Therefore, manufacturers of semiconductor chips have a need for a testing system that is capable of testing a variety of semiconductor chips, and one that quickly and easily converts between testing various semiconductor chips, which are problems not solved by the prior art. Manufacturers of semiconductor chips further have a need for this testing system to be as small as possible so as to maximize valuable cleanroom space.

Thus, it is a primary object of the invention to provide a quick change small footprint testing system and method of use that improves upon the state of the art.

Another object of the invention is to provide a quick change small footprint testing system and method of use that quickly converts between configurations for testing different semiconductor chips.

Yet another object of the invention is to provide a quick change small footprint testing system and method of use that easily converts between configurations for testing different semiconductor chips.

Another object of the invention is to provide a quick change small footprint testing system and method of use that is easy to use.

Yet another object of the invention is to provide a quick change small footprint testing system and method of use that provides accurate testing for semiconductor chips.

Another object of the invention is to provide a quick change small footprint testing system and method of use that can be used with a wide variety of semiconductor chips.

Yet another object of the invention is to provide a quick change small footprint testing system and method of use that is relatively inexpensive.

Another object of the invention is to provide a quick change small footprint testing system and method of use that has a long useful life.

Yet another object of the invention is to provide a quick change small footprint testing system and method of use that has a small footprint.

Another object of the invention is to provide a quick change small footprint testing system and method of use that minimizes the amount of space required to test a variety of semiconductor chips.

Yet another object of the invention is to provide a quick change small footprint testing system and method of use that minimizes the capital cost for testing equipment for testing a variety of semiconductor chips.

Another object of the invention is to provide a quick change small footprint testing system and method of use that provides for quick removal of and replacement of DUT PCBs having testing sockets thereon.

Yet another object of the invention is to provide a quick change small footprint testing system and method of use that is high quality.

Another object of the invention is to provide a quick change small footprint testing system and method of use that is durable.

These and other objects, features, or advantages of the present invention will become apparent from the specification and claims.

SUMMARY OF THE INVENTION

A testing system is presented having a bottom plate, a frame member and a socket plate. The socket plate holds and the frame member houses a plurality of electrical testing components therein. A removable device under test (DUT) printed circuit board (PCB) is placed on top of the socket plate and electrically connects with the electrical testing components. A removable top plate is placed on top of the DUT PCB and is locked in place by a plurality of locking posts connected to an actuating mechanism. The locking posts connect to cam surfaces in the top plate that selectively hold the top plate in place thereby sandwiching the DUT PCB between the top plate and the socket plate. The DUT PCB is quickly and easily removed and replaced by activating the actuating mechanism and removing the top plate. In this way, a single testing system can be used to test a great variety of semiconductor chips thereby reducing capital equipment costs and space needed in cleanrooms.

DETAILED DESCRIPTION OF THE INVENTION

Figure 1:
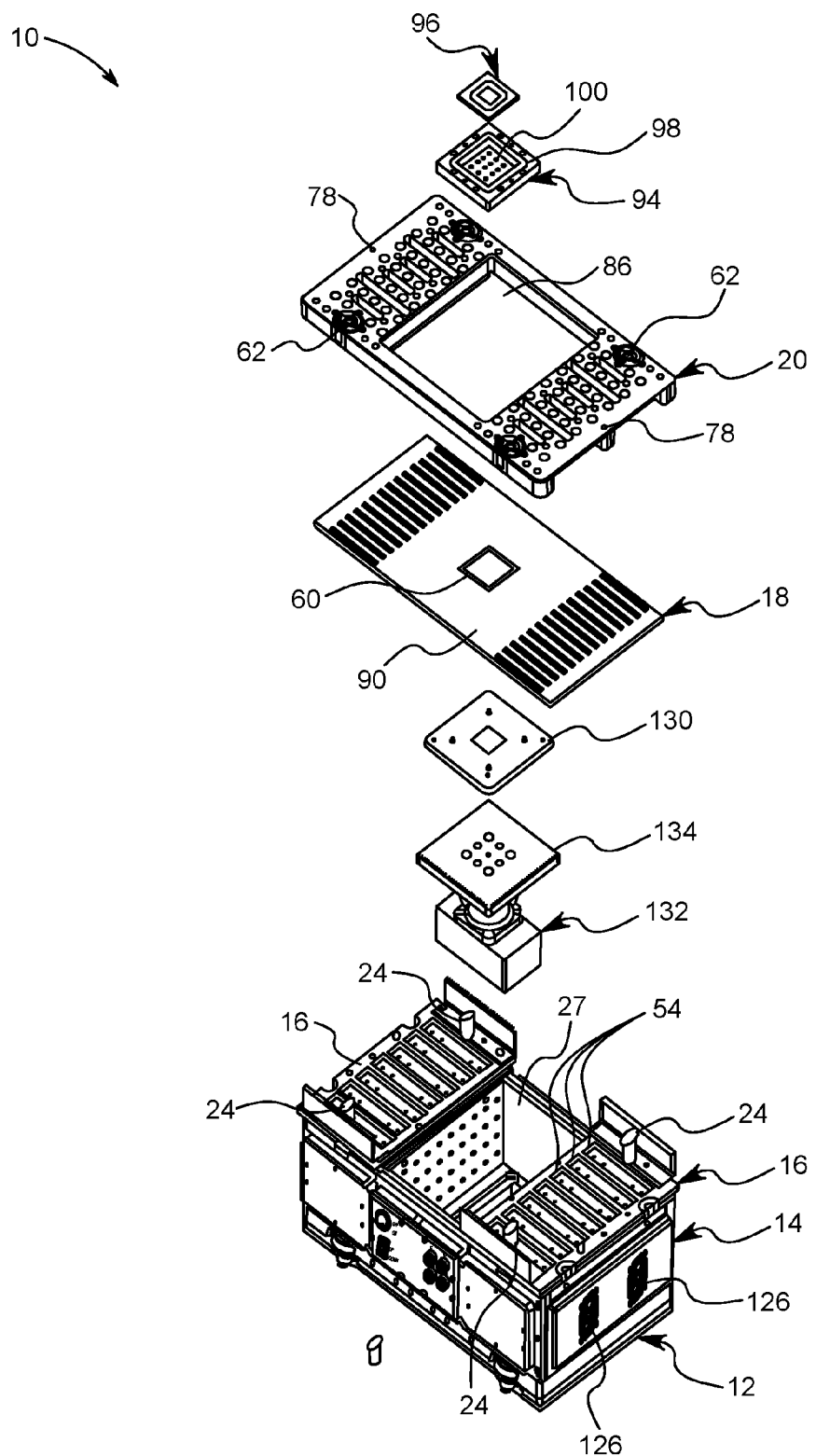
FIG. 1 is an exploded perspective view of a testing system, the view showing the frame member, with the pedestal support, sprite stiffener, DUT PCB, top plate, testing socket and DUT separated from the frame member.
Figure 2:
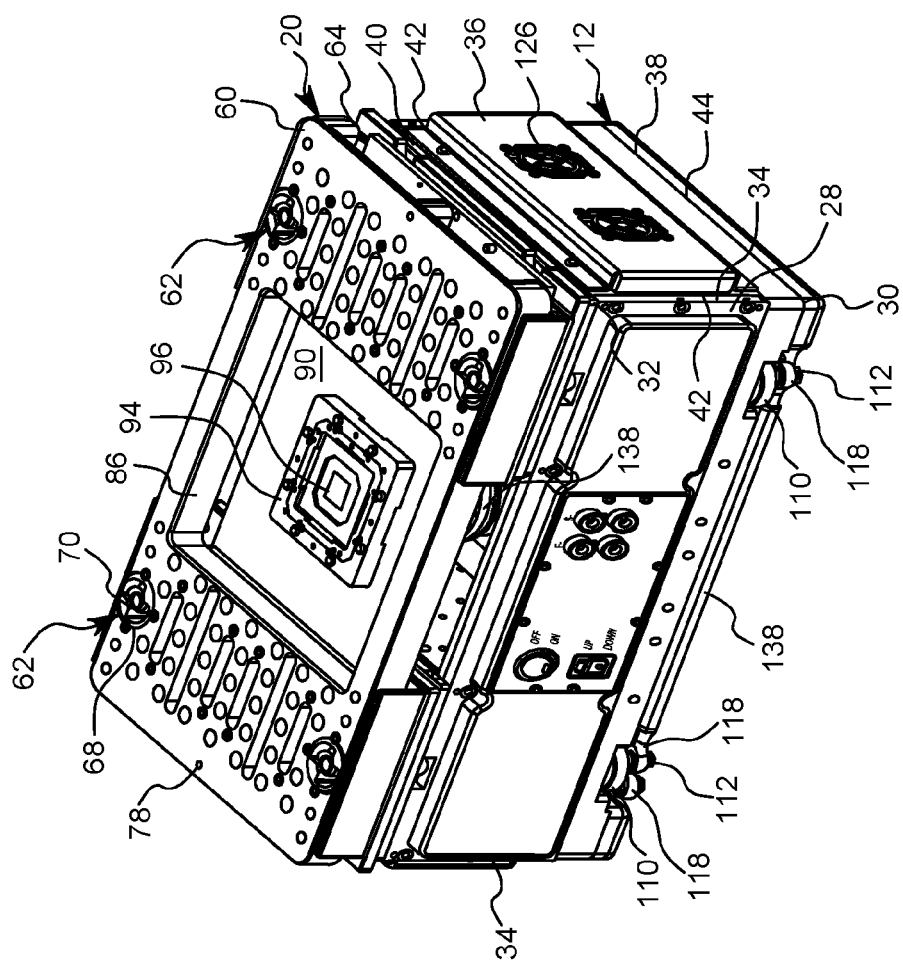
FIG. 2 is a perspective view of the testing system of FIG. 1, the view showing the frame member, DUT PCB, top plate, testing socket and DUT assembled onto the frame member.
Figure 3:
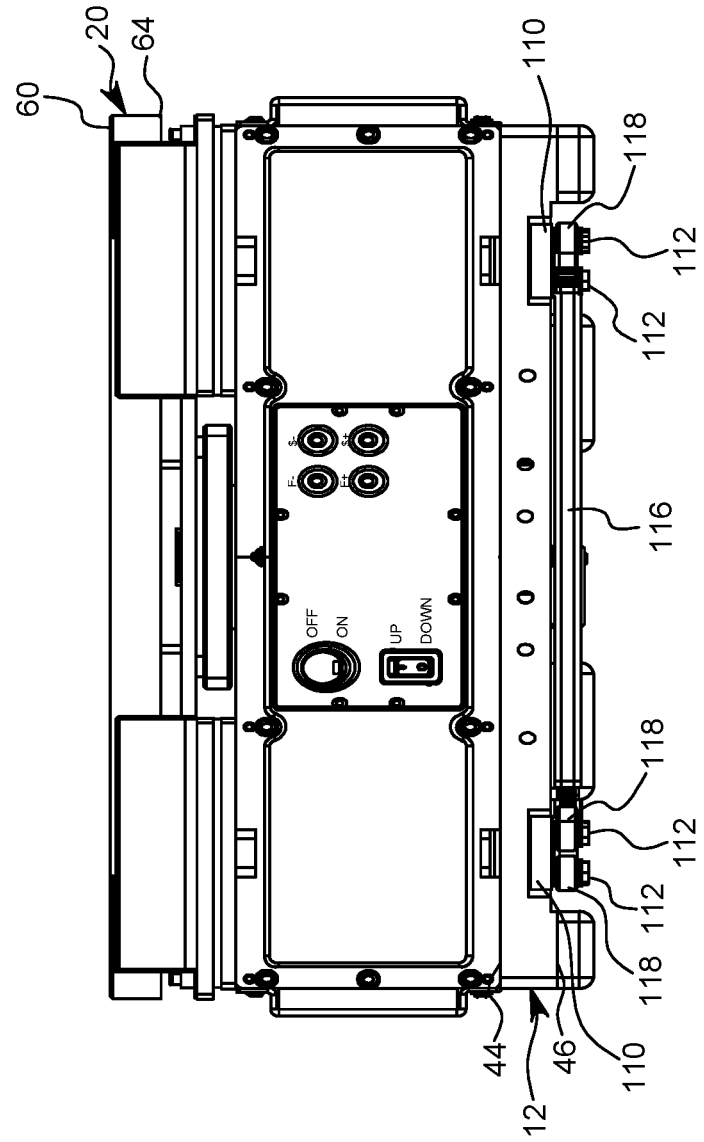
FIG. 3 is a side elevation view of the assembled testing system of FIG. 2.
Figure 4:
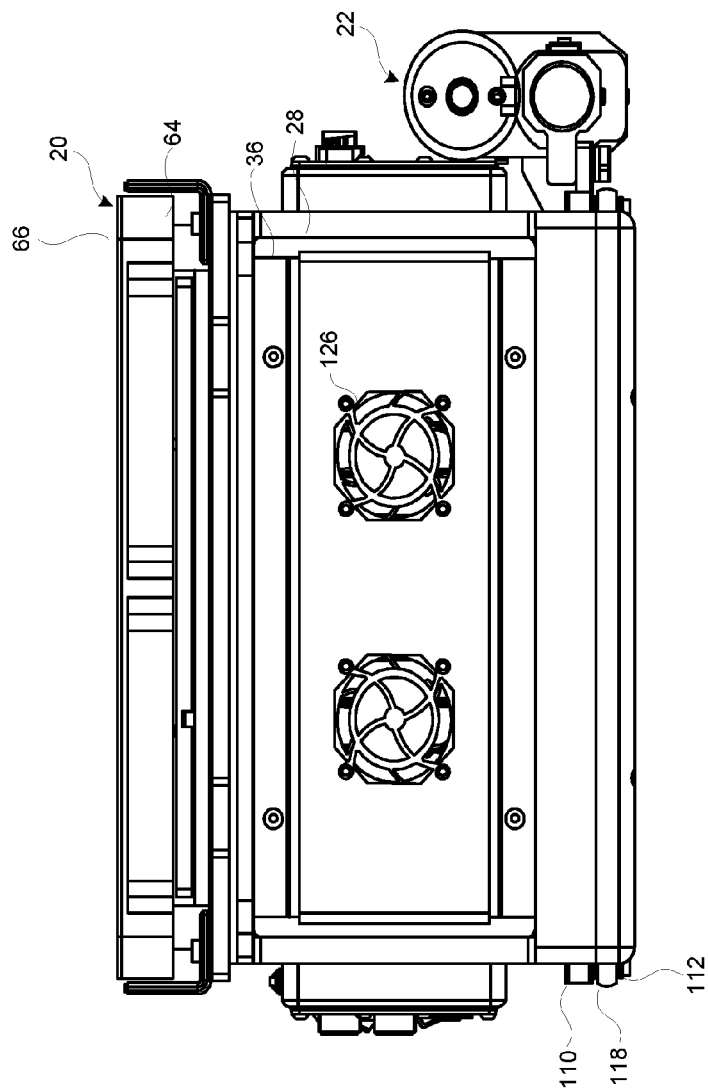
FIG. 4 is an end elevation view of the assembled testing system of FIG. 2.
Figure 5:
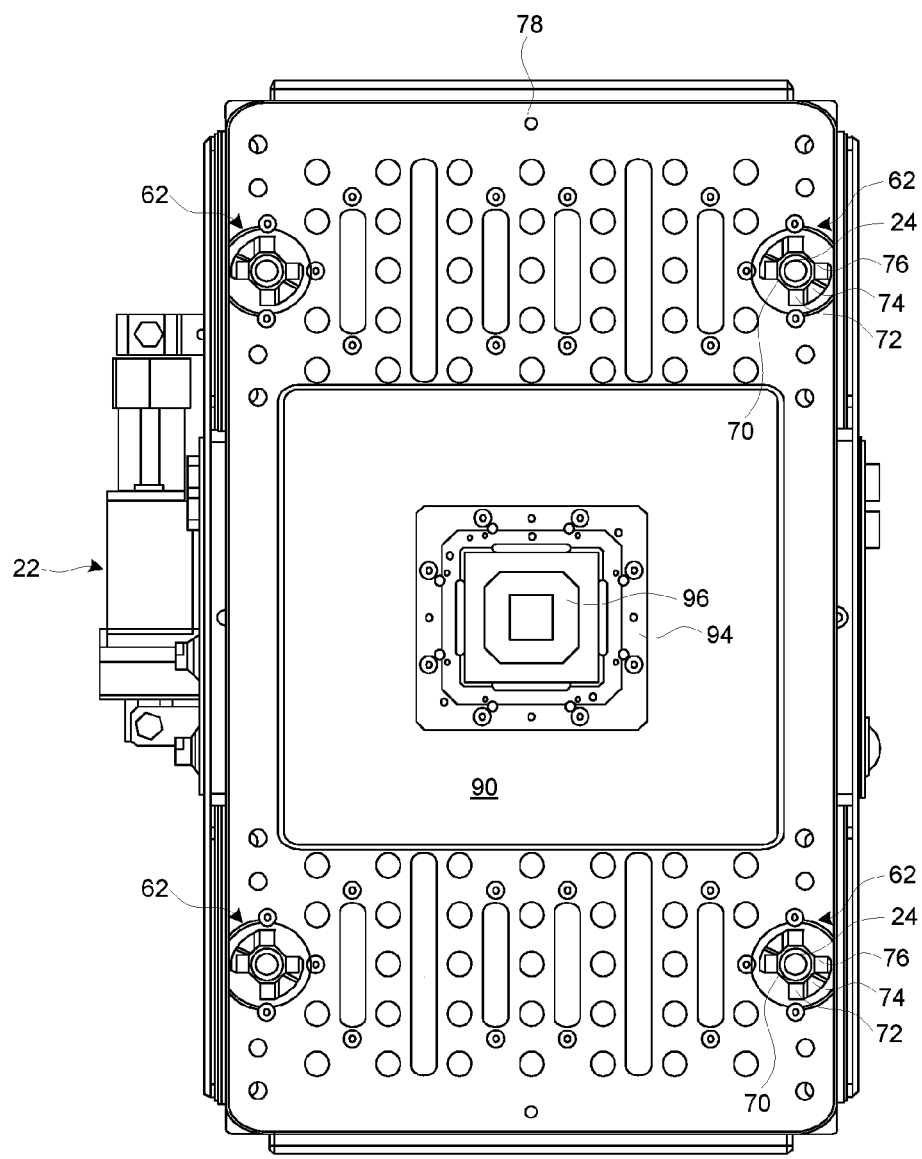
FIG. 5 is a top elevation view of the assembled testing system of FIG. 2.
Figure 6:
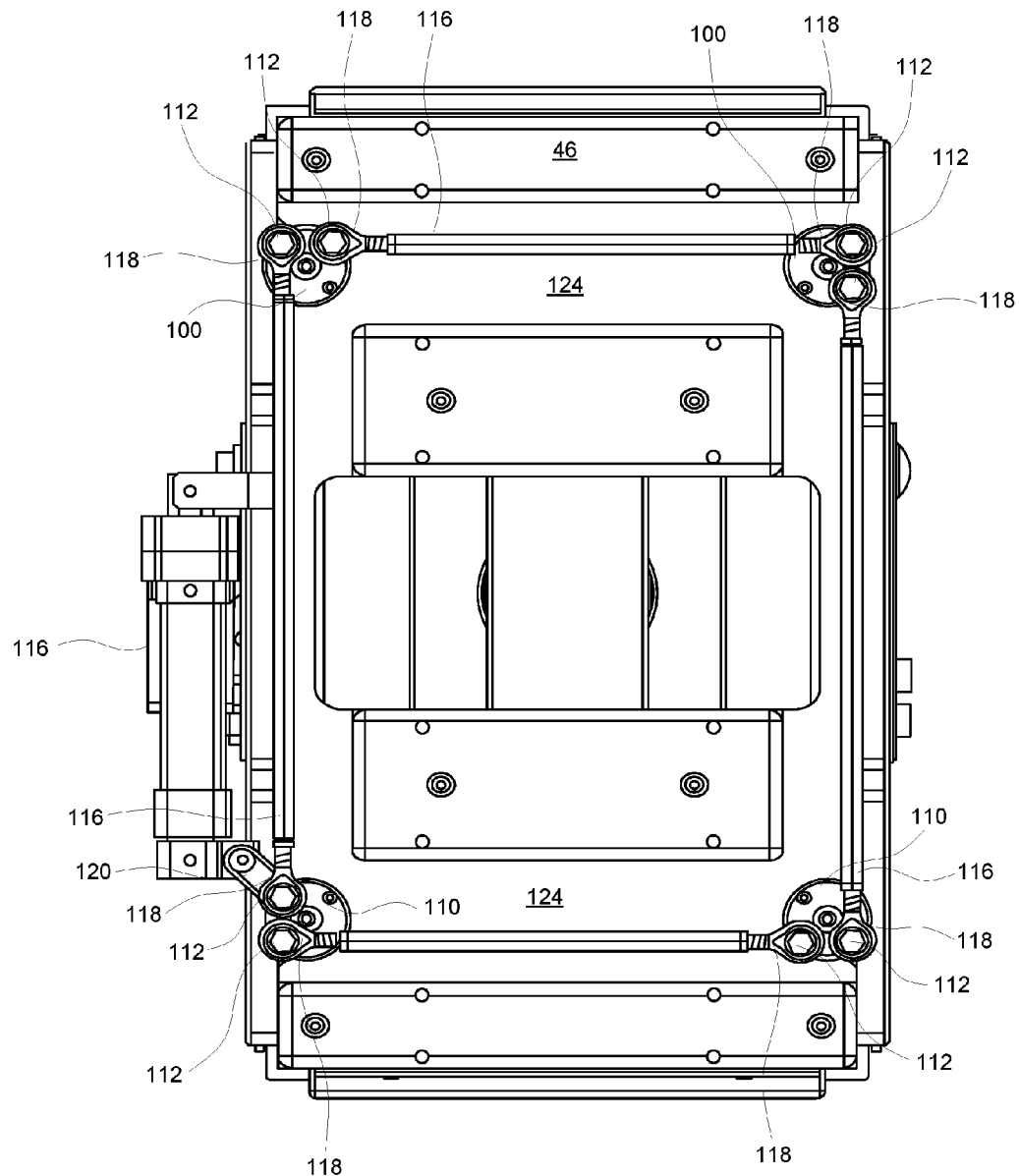
FIG. 6 is a bottom elevation view of the assembled testing system of FIG. 2.
Figure 7:
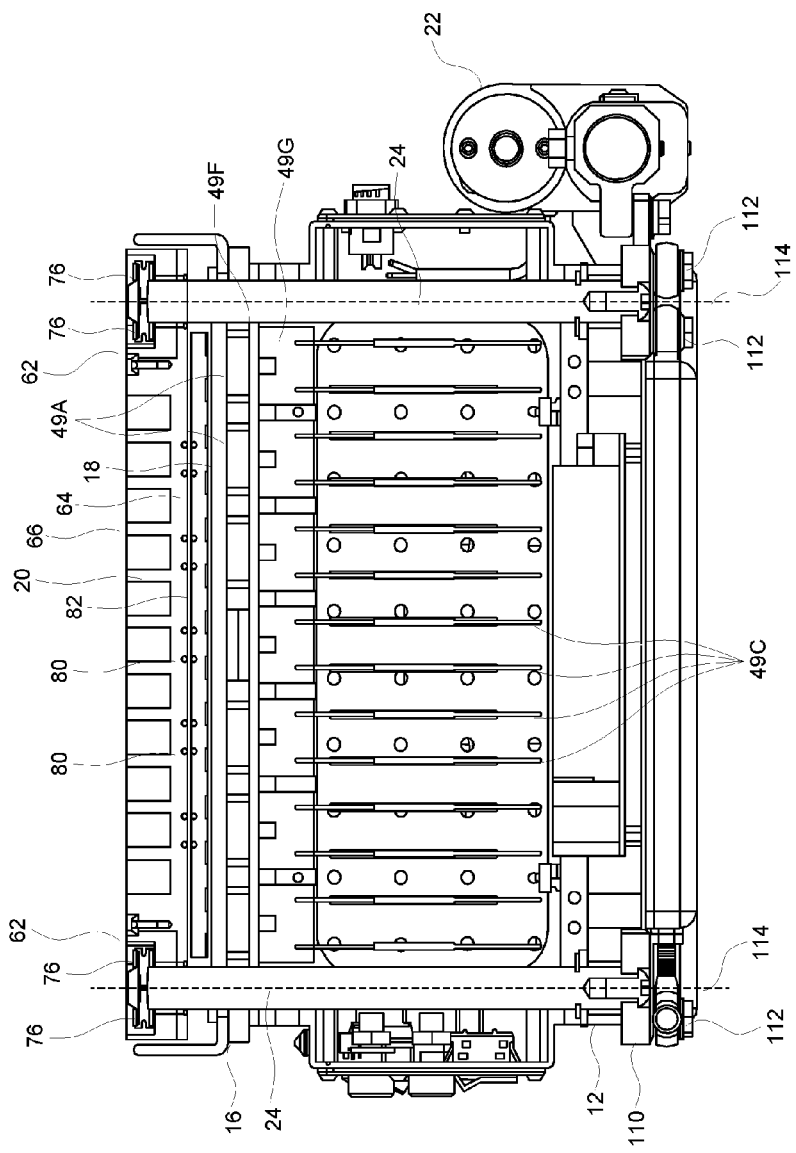
FIG. 7 is a cut-away elevation view through an end of the assembled testing system of FIG. 2, the view cut through the rotation of axis of the locking posts, the view showing the electrical testing boards connected by edge connectors into the sockets, the sockets connected to the tester PCB, the tester PCB connected to the socket plates and the bottom side of the capsules, the capsules electrically connect to the DUT PCB, and the floating plate pressing down on the DUT PCB and the top plate pressing down on the floating plate by compressed compressible members; the view also showing the protrusions of the locking posts held within the cam members of the top plate.
Figure 8:
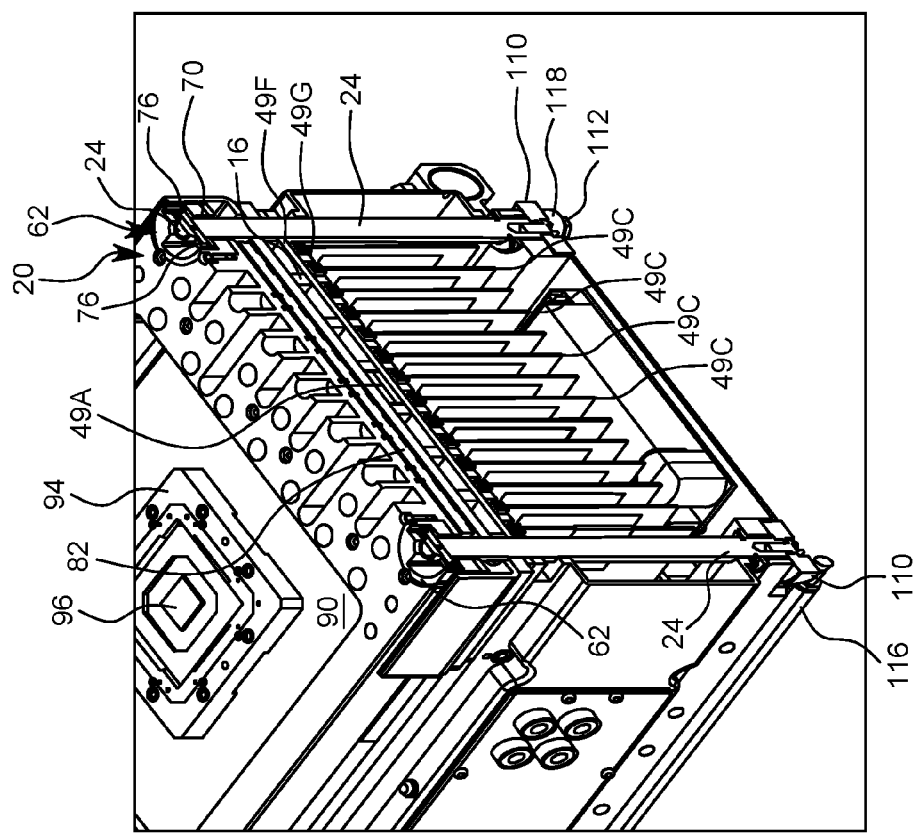
FIG. 8 is a perspective view of the cut away view of FIG. 7, the figure also showing the testing aperture in the top plate and the testing socket connected to the upper surface of the DUT PCB and a DUT positioned within the testing socket.
Figure 9:
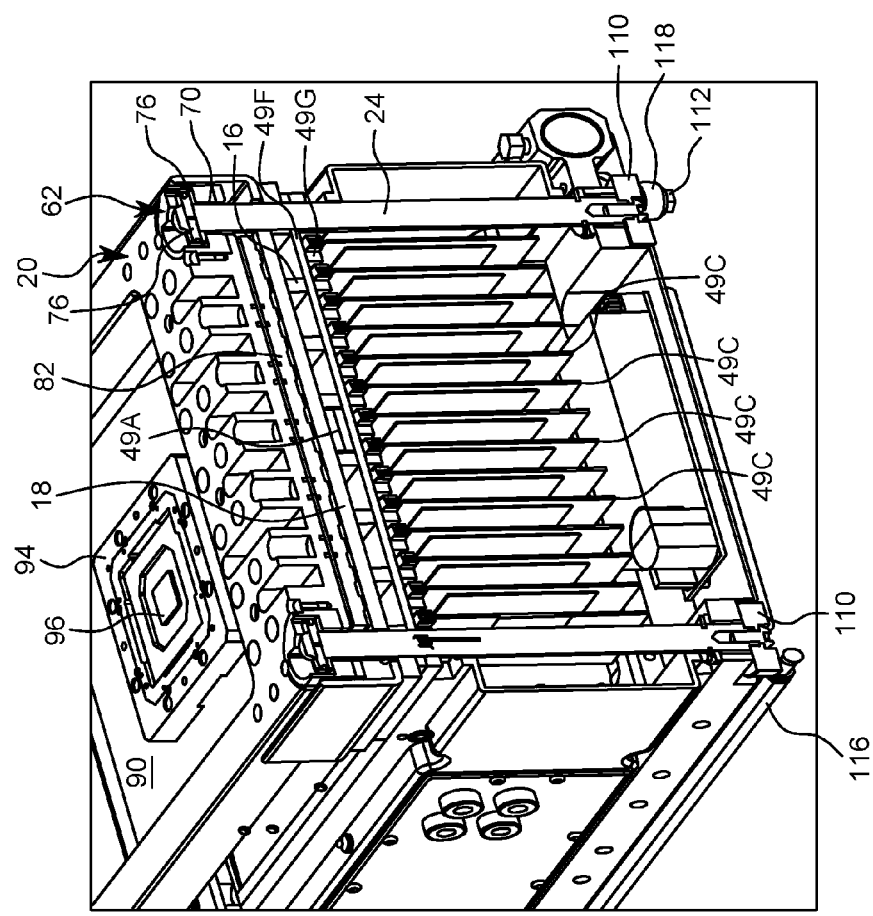
FIG. 9 is a second perspective view of the cut away view of FIG. 7, the figure also showing the testing aperture in the top plate and the testing socket connected to the upper surface of the DUT PCB and a DUT positioned within the testing socket.
Figure 10:
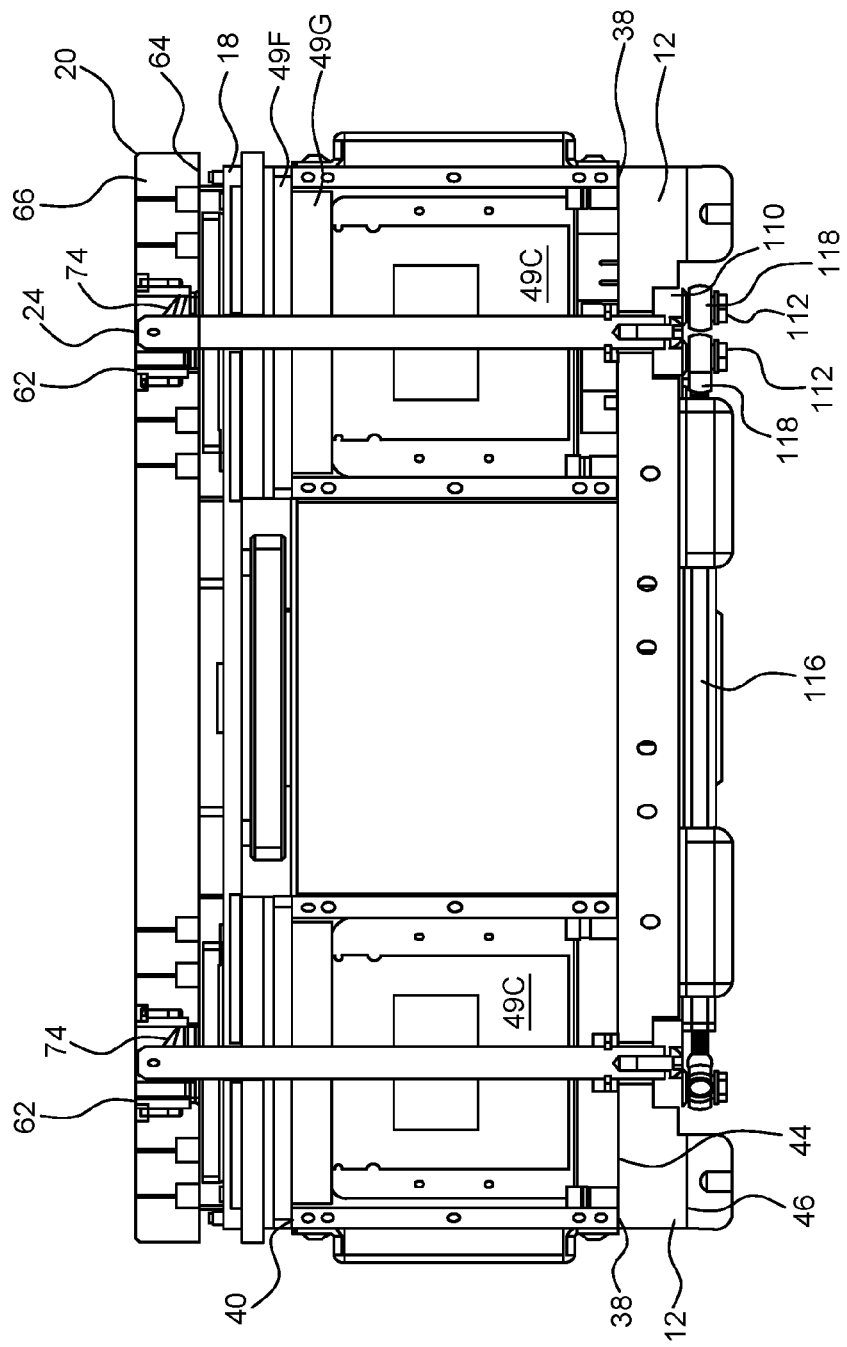
FIG. 10 is a cut-away elevation view through a side of the assembled testing system of FIG. 2, the view cut through the rotation of axis of the locking posts, the view showing the electrical testing boards connected by edge connectors into the sockets, the sockets connected to the tester PCB, the tester PCB connected to the socket plates and the bottom side of the capsules, the capsules electrically connect to the DUT PCB, and the floating plate pressing down on the DUT PCB and the top plate pressing down on the floating plate by compressed compressible members; the view also showing the protrusions of the locking posts held within the cam members of the top plate.
Figure 11:
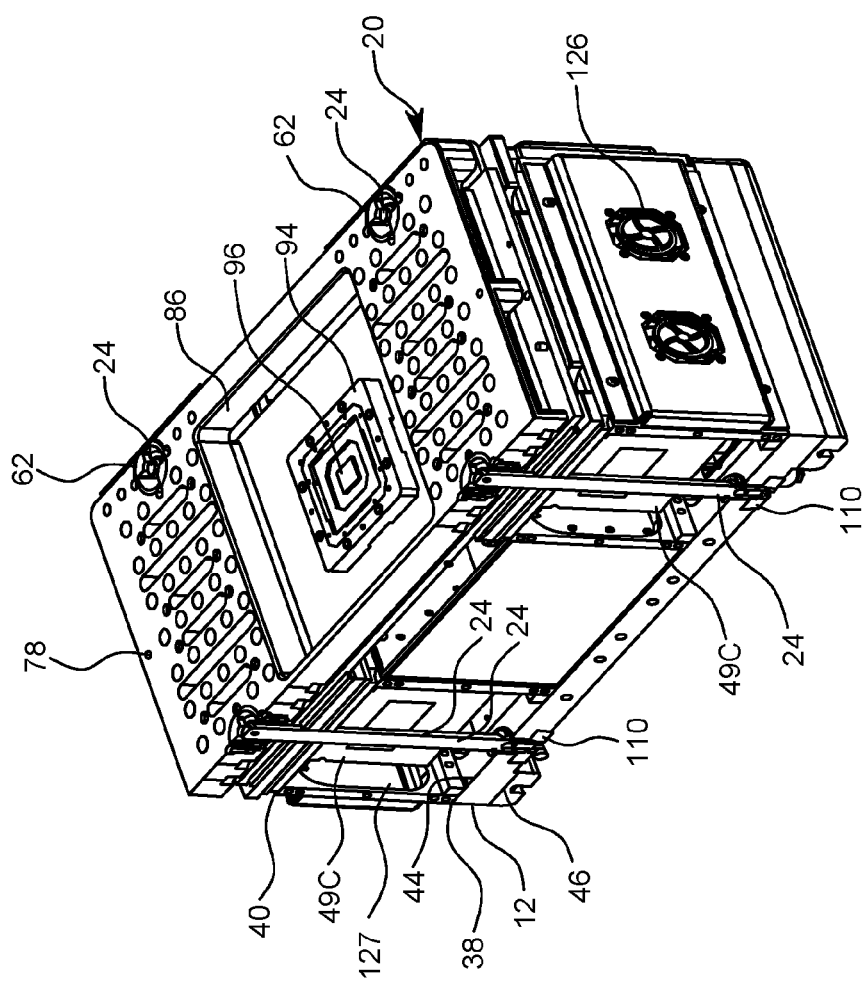
FIG. 11 is a perspective view of the cut away view of FIG. 10, the figure also showing the testing aperture in the top plate and the testing socket connected to the upper surface of the DUT PCB and a DUT positioned within the testing socket.
Figure 12:
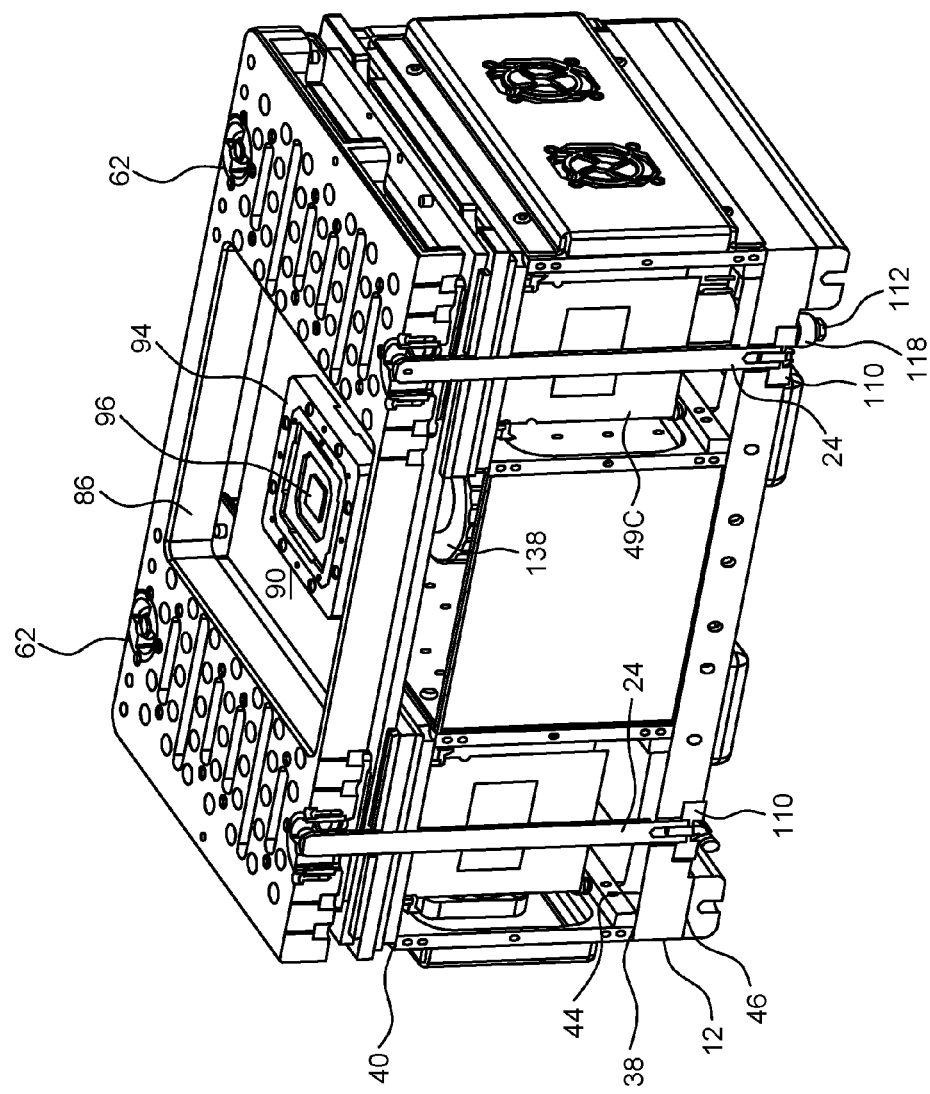
FIG. 12 is a second perspective view of the cut away view of FIG. 10, the figure also showing the testing aperture in the top plate and the testing socket connected to the upper surface of the DUT PCB and a DUT positioned within the testing socket.
Figure 13:
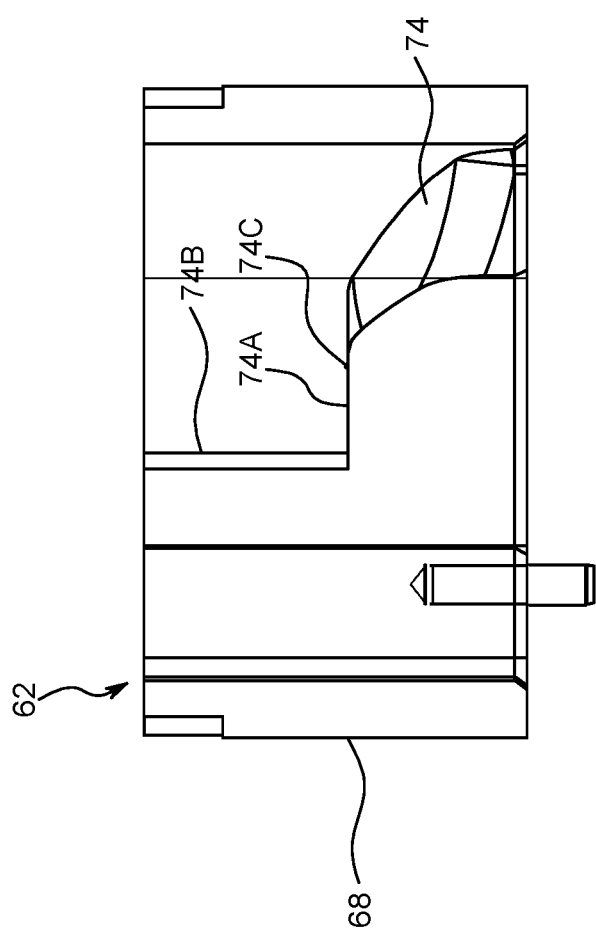
FIG. 13 is a side elevation cut-away view of a cam member, the view showing the cam surface next to the key slot opening, the cylindrical opening, the flat upper surface and the stop surface.
Figure 14:
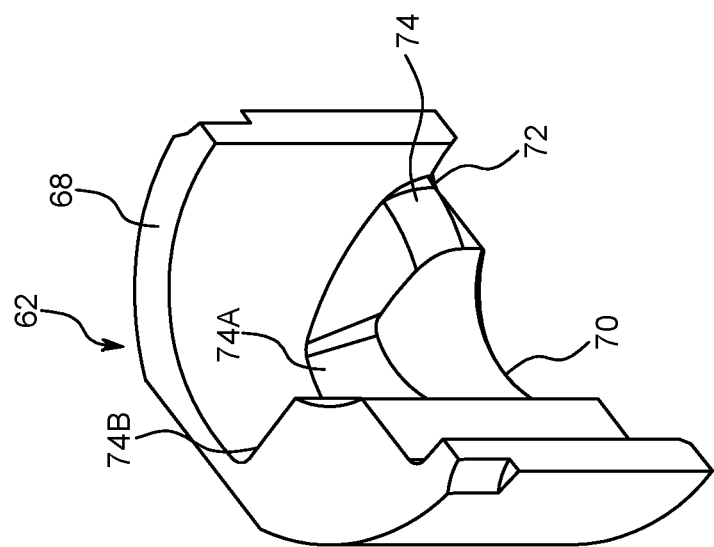
FIG. 14 is a perspective view of the cut away view of FIG. 13.
Figure 15:
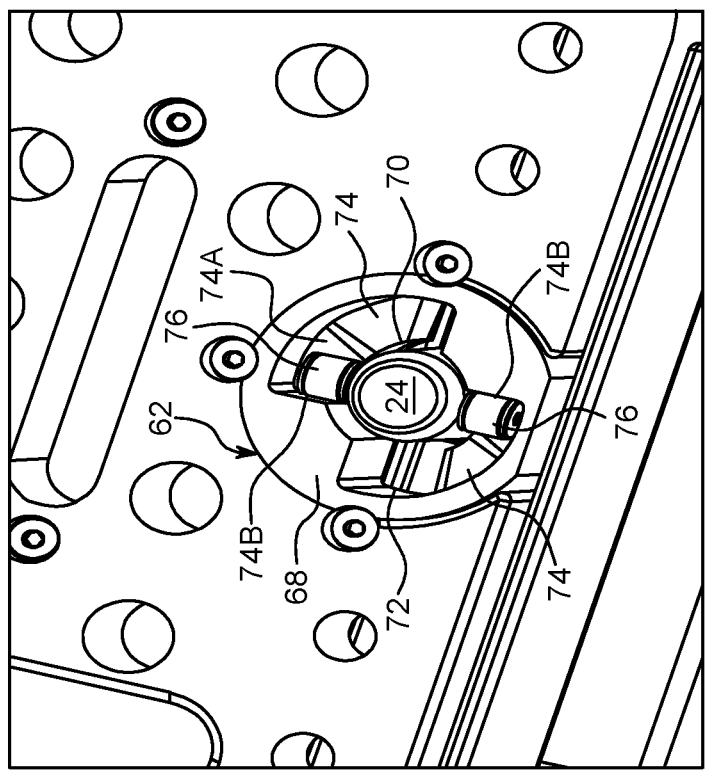
FIG. 15 is a perspective view of the upper surface of the top plate showing a close up view of a cam member with a locking post inserted therein and in an engaged position wherein the protrusions are in engagement with the stop surfaces and sitting on the flat upper surfaces; the view showing the key slot openings and the cylindrical opening, the view also showing the cam surfaces.
Figure 16:
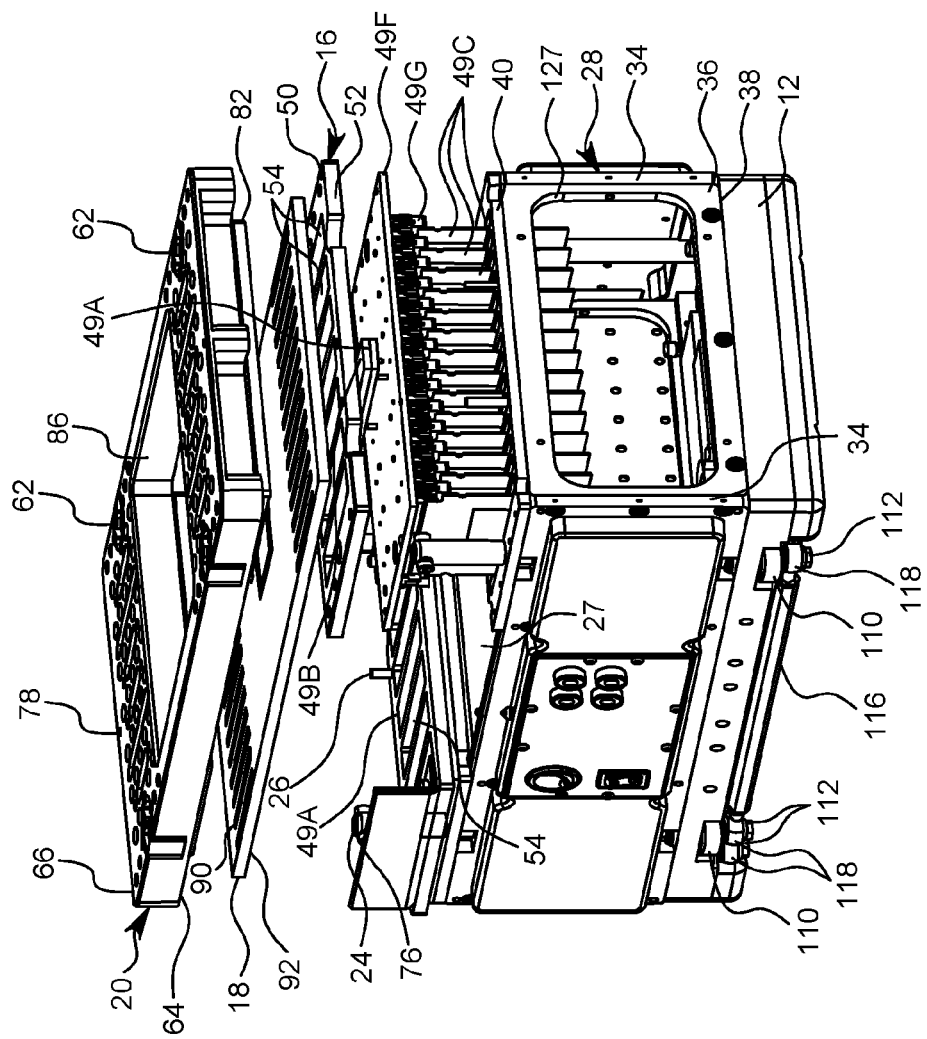
FIG. 16 is an exploded perspective view of the system, the view showing the top plate, the DUT PCB exploded off of the frame member; the view also showing one side of the system having the socket plate with socket openings exploded off of the tester PCB with a capsule in a demonstrative position below a socket opening; the view showing electrical testing cards connected by edge connectors to sockets connected to the lower surface of tester PCB; the view also showing the opening for air flow into the end wall.
Figure 17:
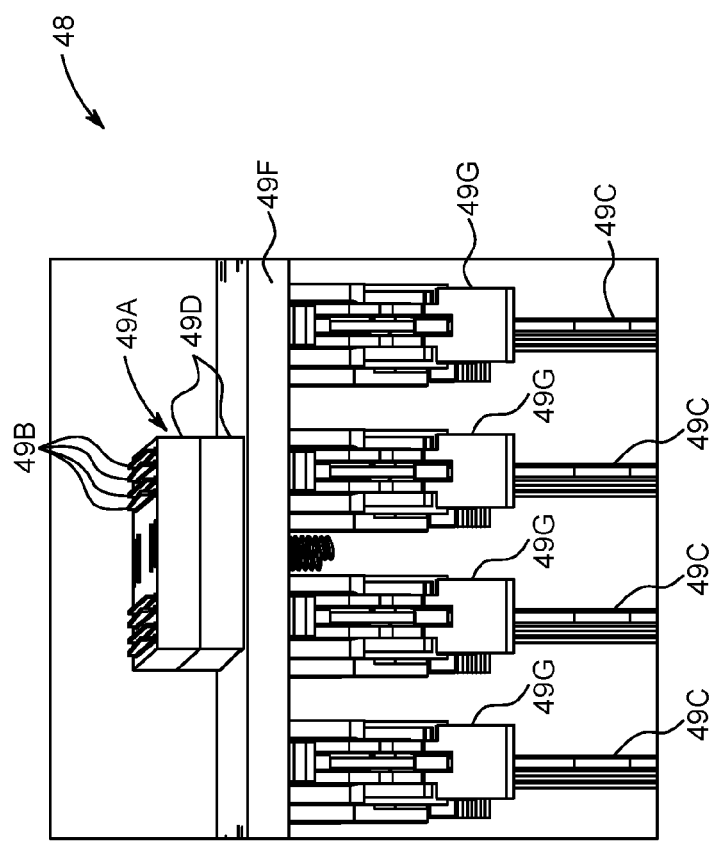
FIG. 17 is a close up perspective view showing a capsule with compressible electrical contacts extending upward from the capsule's upper surface, the capsule connected to the upper surface of a tester PCB; the view also a plurality of sockets connected to the lower surface of the tester PCB, the sockets holding an electrical testing board by way of an edge connector therein.
Figure 18:
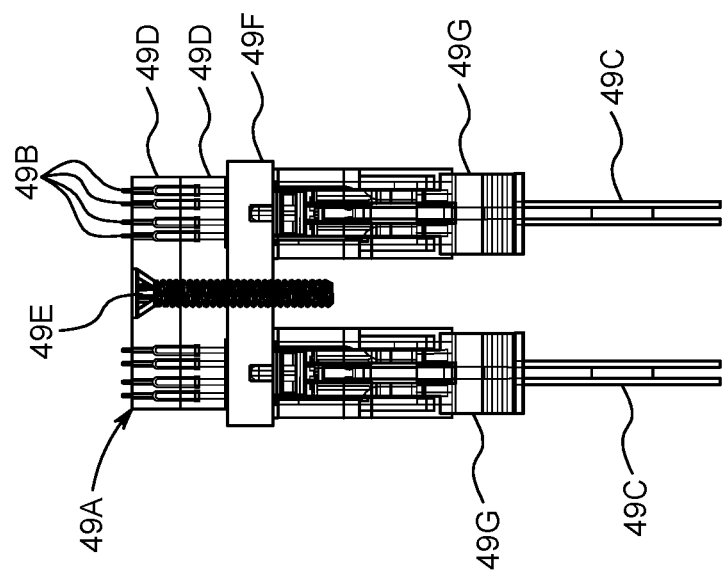
FIG. 18 is a close up side elevation view of two sockets, a portion of the tester PCB and a capsule; the view showing various components in hidden lines including a fastener and the compressible electrical components including the springs therein.
Figure 19:
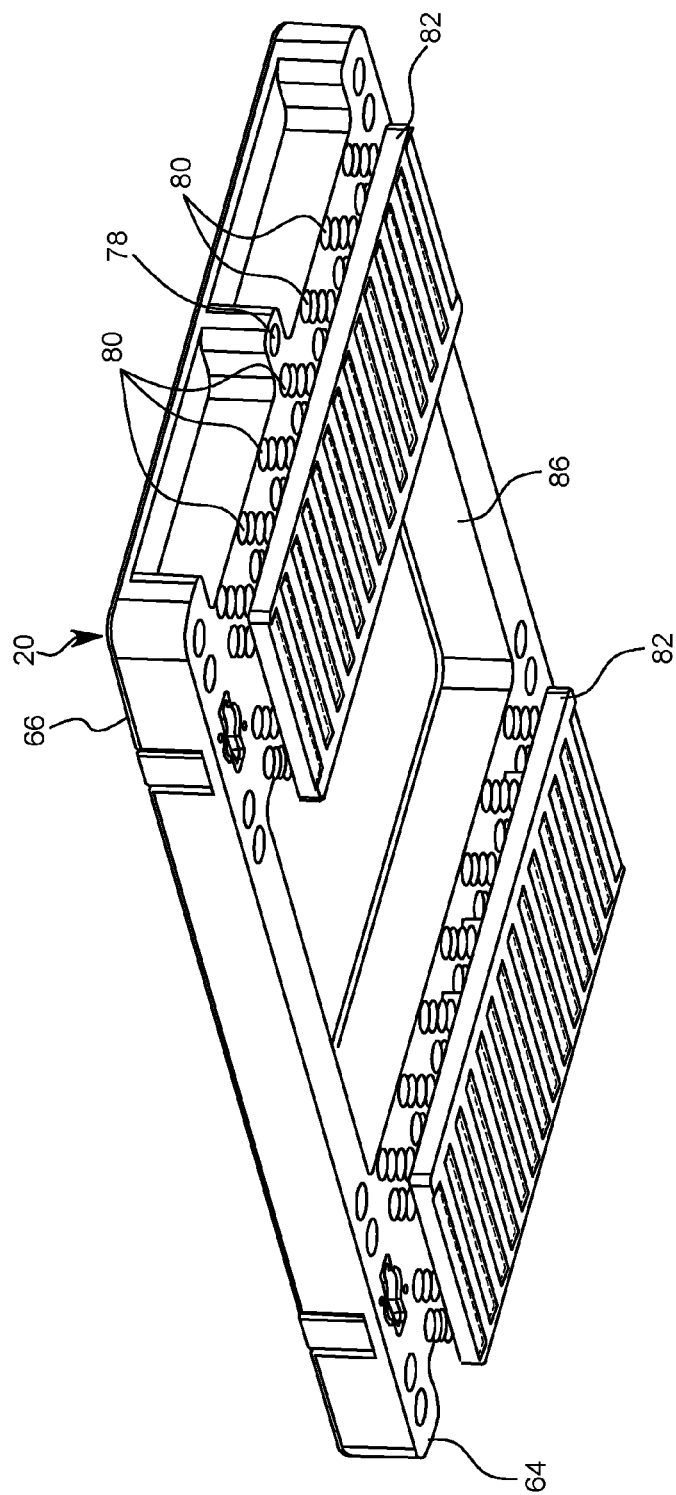
FIG. 19 is a bottom perspective view of a top plate, the view showing the floating plates connected to the bottom surface of the top plate by a plurality of compressible members.
Figure 20:
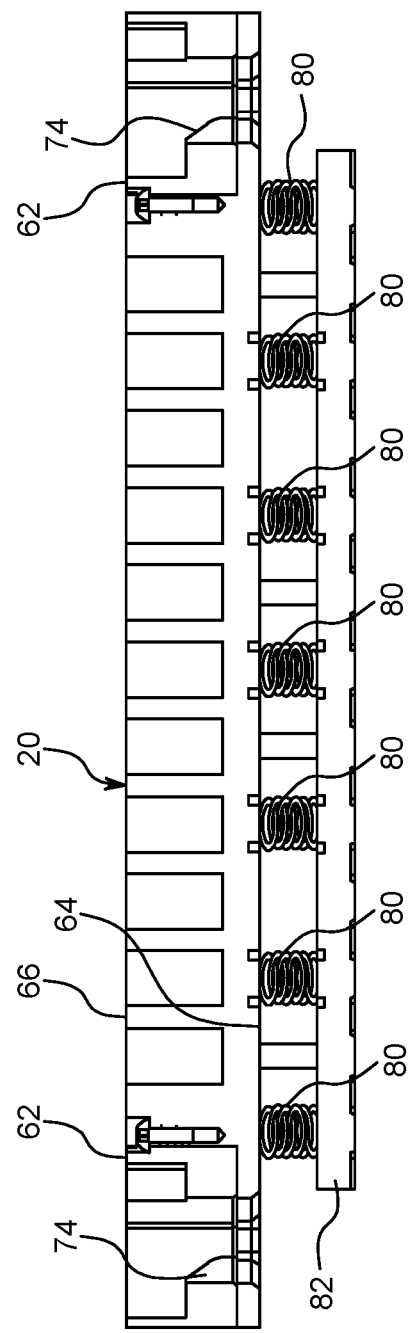
FIG. 20 is a side perspective view of the top plate of FIG. 19.
Figure 21:
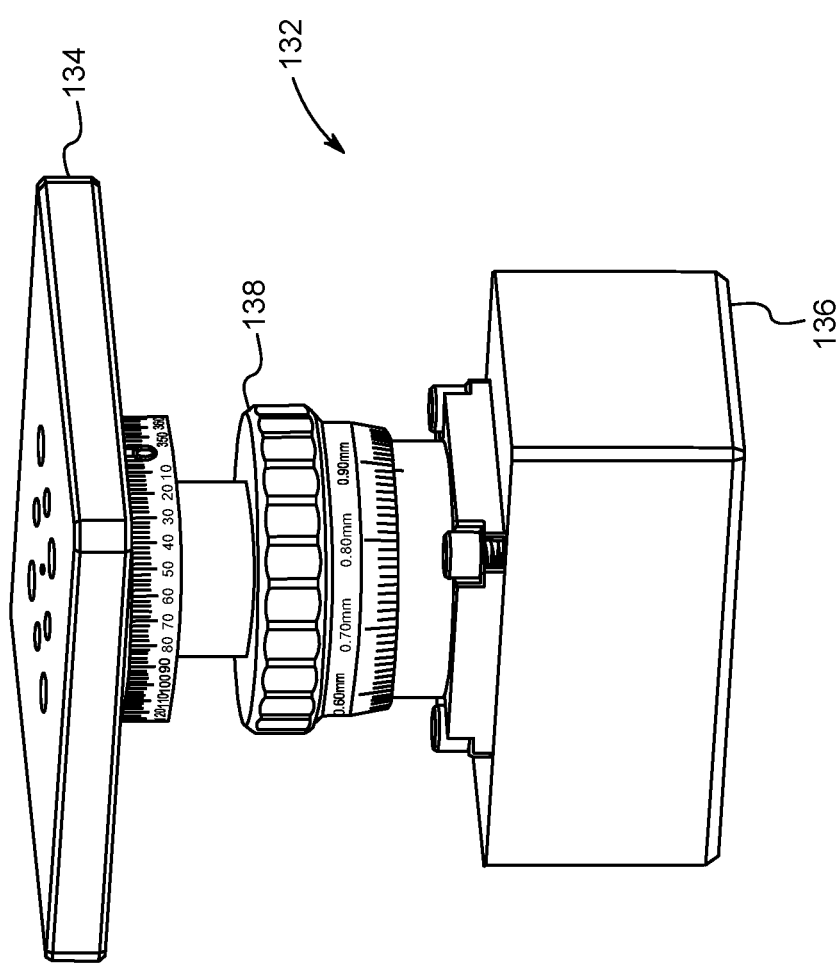
FIG. 21 is a perspective view of an adjustment mechanism.
Figure 22:
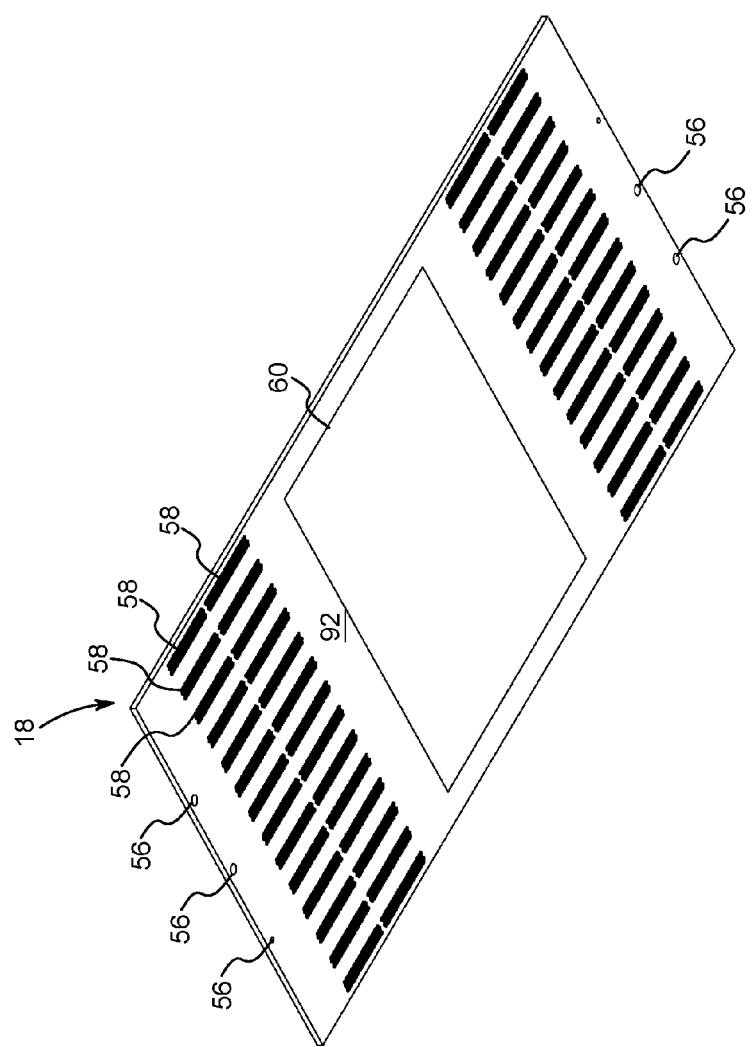
FIG. 22 is a bottom perspective view of the DUT PCB, the view showing the contact fields 50 in rows on opposing sides of the DUT PCB, the view also showing the center area of the DUT PCB.
Figure 23:
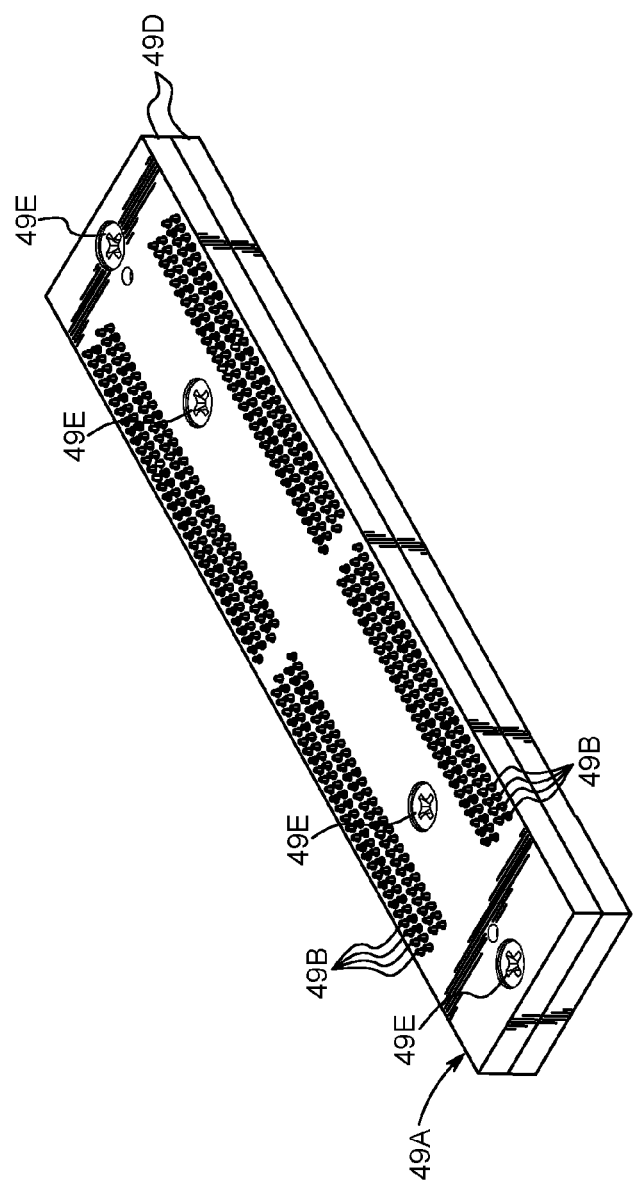
FIG. 23 is a top perspective view of a capsule, the view showing a plurality of compressible contacts aligned in two sets of rows, each set having four rows of contacts therein the rows separated by an isle down the middle that provides room for fasteners, the view showing the capsules formed of two opposing halves connected together along a seamline.
Figure 24:
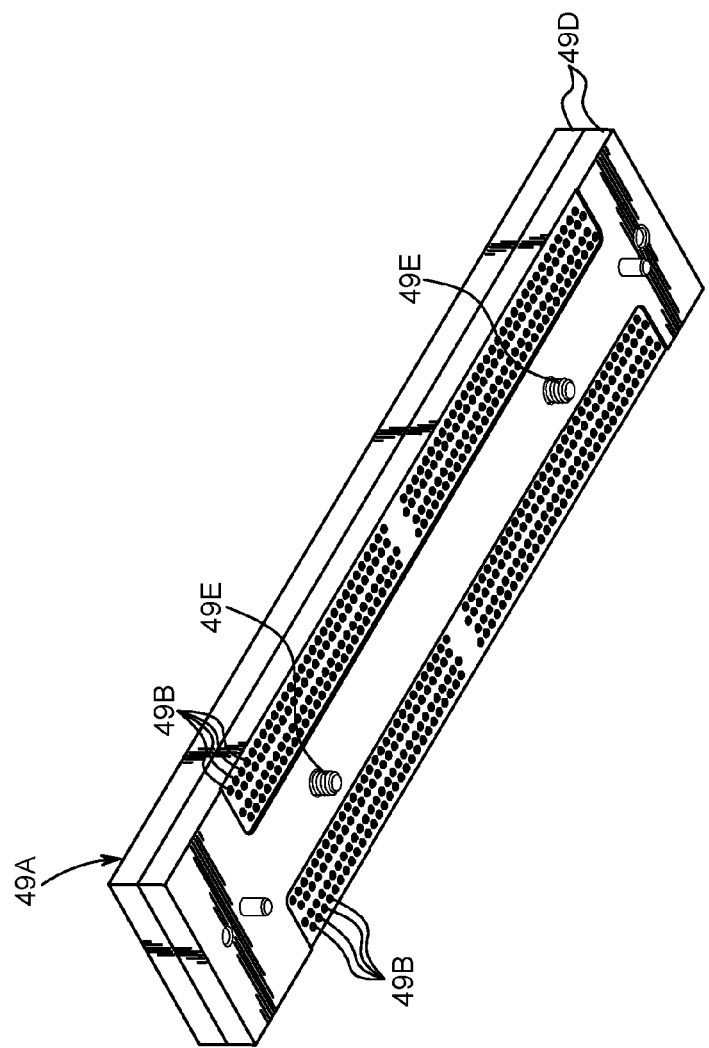
FIG. 24 is a bottom perspective view of a capsule, the view showing a plurality of compressible contacts (or contact pads or sockets) aligned in two sets of rows, each set having four rows of contacts therein the rows separated by an isle down the middle that provides room for fasteners, the view showing the capsules formed of two opposing halves connected together along a seamline.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that mechanical, procedural, and other changes may be made without departing from the spirit and scope of the invention(s). The following detailed description is, therefore, not to be taken in a limiting sense, and the scope of the invention(s) is defined only by the appended claims, along with the full scope of equivalents to which such claims are entitled.

As used herein, the terminology such as vertical, horizontal, top, bottom, front, back, end, sides and the like are referenced according to the views, pieces and figures presented. It should be understood, however, that the terms are used only for purposes of description, and are not intended to be used as limitations. Accordingly, orientation of an object or a combination of objects may change without departing from the scope of the invention.

With reference to the figures, a testing system 10 is presented. Testing system 10 is formed of any suitable size, shape and design. In the arrangement shown, as one example, testing system 10 includes a bottom plate 12, a frame member 14, a socket plate 16, a device under test printed circuit board (or DUT PCB) 18, a top plate 20, an actuating mechanism 22, a plurality of locking posts 24, and a plurality of alignment posts 26 among other components.

Frame member 14 is formed of any suitable size, shape and design. In the arrangement shown, as one example, fame member 14 is generally square or rectangular in shape and forms a hollow interior 27 which houses other components of the system 10, as is further described herein. Frame member 14 is formed of a pair of opposing sidewalls 28 that extend from a lower end 30 to an upper end 32 in approximate parallel spaced relation to one another. Sidewalls 28 connect at their outward edges 34 to end walls 36. A pair of opposing end walls 36, like sidewalls 28, extend from a lower end 38 to an upper end 40 in approximate parallel spaced relation to one another. End walls 36 connect at their outward edges 42 to the outward edges 34 of sidewalls 28. Sidewalls 28 and end walls 36 are arranged in approximate perpendicular alignment to one another. In this way, the connection of sidewalls 28 to end walls 36 forms a generally square or rectangular box or frame that houses the components shown and described herein. However, any other size or shape of frame member 14 is hereby contemplated for use.

The sidewalls 28 and end walls 36 of frame member 14 connect at their lower ends 30/38 to bottom plate 12. Bottom plate 12 is formed of any suitable size, shape and design and is used for supporting and closing the lower end of testing system 10 for placement on a table, desk or other surface, or alternatively for connecting system 10 to another machine, such as a semiconductor testing system, automated testing system, a pick and place machine or any other machine or device. Bottom plate 12 is generally planar in shape, and defines a generally planar upper surface 44 and a generally planar lower surface 46.

The sidewalls 28 and end walls 36 of frame member 14 connect at their upper ends 32/40 to socket plate 16. In the arrangement shown, one socket plate 16 is positioned on either side of the center of frame member 14. However, any number of socket plates 16 are hereby contemplated for use, such as one, or an arrangement wherein four socket plates 16 are used, one on each side of the center of frame member 14, each socket plate 16 positioned in 90° alignment or square alignment to the adjacent socket plates 16. Socket plates 16 are formed of any suitable size, shape and design and are used for connecting to or holding a plurality of electrical testing components 48 therein as is further described herein. In the arrangement shown, socket plates 16 are generally planar in shape, with a generally planar upper surface 50 and a generally planar lower surface 52. In the arrangement shown, one socket plate 16 is connected to each side of frame member 14 each of which include a plurality of socket openings 54 therein that are sized and shaped to receive and electrically connect to electrical testing components 48, as is further described herein.

When installed, the upper end of electrical testing components 48 are held within the socket openings 54 with the remaining portions of electrical testing components 48 hanging vertically downward therefrom within the hollow interior formed by frame member 14. This arrangement allows for a high density of electrical testing components 48 within a small footprint.

In one arrangement, electrical testing components 48 include a rigid capsule 49A which is removably held within or connected to socket opening 54. In one arrangement, rigid capsules 49A include a plurality of compressible electrical contacts 49B in its upward facing surface that extend upward therefrom and/or in its downward facing surface that extend down ward. Alternatively, the downward facing surface of rigid capsules 49A include contact fields or sockets that are used to make electrical connections (instead of spring loaded or compressible electrical contacts 49B). These compressible electrical contacts 49B are electrically connected to an electrical testing board 49C, also known as a card. In the arrangement shown, electrical testing boards are vertically aligned and extends downward from the rigid capsule 49A. As a rigid capsule 49A with compressible electrical contacts 49B is connected to or placed in each socket opening 54, these electrical testing boards 49C or cards are aligned in approximate parallel spaced relation within the hollow interior of testing system 10 in close but spaced relation to one another. This allows the maximum density of electrical testing boards 49C to be electrically connected the system 10.

In one arrangement, as is shown, rigid capsules 49A are generally rectangular in shape and have generally planar upper and lower surfaces which oppose one another in approximate parallel spaced relation. In this arrangement, rigid capsules 49A are formed of a pair of opposing halves 49D that connect together in generally flush engagement with one another and are held together, in one arrangement, by fastener 49E, however any other manner of connection is hereby contemplated for use. In one arrangement, these compressible electrical contacts 49B are known in the industry as pogo pins. A Pogo pin is a device used in electronics to establish a (usually temporary) connection between two printed circuit boards. Named by analogy with the pogo stick toy, the pogo pin usually takes the form of a slender cylinder containing two sharp, spring-loaded pins. Pressed between two electronic circuits, the sharp points at each end of the pogo pin make secure contacts with the two circuits and thereby connect them together.

In one arrangement, compressible electrical contacts 49B also extend out of the lower surface of the rigid capsule 49A as well as the upper surface, whereas in other arrangements, the lower surface of rigid capsule 49A includes sockets or electrical contact pads as is further described herein.

In the arrangement shown, wherein rigid capsules 49A are generally rectangular in shape, the socket openings 54 in socket plate 16 similarly generally rectangular in shape and are sized and shaped to receive rigid capsules 49A therein with close tolerances. In this arrangement, the plurality of socket openings 54 and therefore the plurality of rigid capsules 49A are aligned in approximate parallel spaced relation in rows across the socket plate 16. As one socket plate 16 is positioned on each side of the system 10, this arrangement forms a pair of rows of socket openings 54 and capsules 49A, one on each side of the system 10.

The upper surface of capsules 49A is configured to electrically connect to the lower surface of DUT PCB 18, and the lower surface of capsules 49 is configured to electrically connect to the upper surface of tester printed circuit board 49F (tester PCB). In one arrangement, capsules 49A are connected to the upper surface of tester PCB 49F by fasteners 49E which extend through and connect both capsules 49A and tester PCB 49F, in spaced alignment to one another such that the capsules 49A fit within the plurality of socket openings 56 in socket plate 16.

A plurality of sockets 49G are connected to the lower surface of tester PCB 49F. Sockets 49G are formed of any suitable size, shape and design and serve to removably receive electrical testing boards 49C and electrically connect the electrical testing boards 49C to the tester PCB 49F, the capsules 49A and therefore the rest of the electrical components of the system 10. In the arrangement shown, sockets 49G include an edge connector. That is, sockets 49G receives the upper edge of an electrical testing board 49C therein that holds the electrical testing board 49C therein and serves to electrically connect the electrical testing board 49C. In the arrangement shown, two sockets 49G are used to connect to a single capsule 49A. In one arrangement, as is shown, each capsule 49A includes eight rows of compressible electrical contacts 49B, which are separated into two groups, one group for each electrical testing board 49B. Also, as shown, seven capsules 49A are connected to each socket plate 16 and tester PCB 49F and therefore fourteen electrical testing boards 49C are used on each side of system 10. However any other number of sockets, capsules and electrical testing boards are hereby contemplated for use.

When assembled, the electrical contacts in the upper edges of electrical testing boards 49C are electrically in contact with the sockets 49G. The sockets 49G electrically connect to the tester PCB 49F. The tester PCB 49F electrically connects to the capsules 49A, which are held within the socket openings 54 of socket plate 16. When the DUT PCB 18 is placed on top of the socket plate 16, the compressible electrical contacts 49B in the capsules 49A electrically contact the contact fields 58 in the lower surface of DUT PCB 18, as is further described herein.

Device under test (DUT) Printed circuit board 18 (DUT PCB 18) sits on top of socket plate 16. DUT PCB 18 is formed of any suitable size shape and design. In the arrangement shown, DUT PCB 18 is generally square or rectangular in shape with its periphery being smaller or slightly smaller than the periphery of frame member 14 such that DUT PCB 18 fits within the exterior edge of frame member 14 when placed on top of frame member 14.

In one arrangement, as is shown, a plurality of alignment posts 26 extend upward a distance from the upper end 32/40 of frame member 14 in approximate parallel alignment with the height of testing system 10. Alignment posts 26 are formed of any suitable size, shape and design. In the arrangement shown, alignment posts 26 are generally cylindrical rods. Alignment posts 26 align with alignment openings 56 in DUT PCB 18 when DUT PCB 18 is properly aligned with frame member 14 and placed on top of frame member 14. DUT PCB 18 includes a plurality of electrical contact fields 58 or electrical pads positioned in the lower surface of DUT PCB 18. In this way, when DUT PCB is placed on top of frame member 14 over alignment posts 24, the electrical contact fields 58 of DUT PCB 18 are accurately aligned with spring loaded or compressible electrical contacts 49A of the capsules 49A of electrical testing components 48. In this way, spring loaded or compressible electrical contacts 49A of electrical testing components 48 electrically connect with contact fields 58 of DUT PCB 18. In one arrangement, the alignment posts 26 are configured such that the DUT PCB 18 and/or the top plate 20 can only be positioned on top of the system 10 in one manner of alignment, thereby preventing improper assembly of the system 10.

In the arrangement wherein two rows of electrical testing boards 49C, sockets 49G and capsules 49A are part of the system 10, with one row on each side of the system 10, the contact fields 58 of DUT PCB 18 are similarly aligned in two rows, one row on either side of the center of the DUT PCB 18. This arrangement leaves the center area 60 of DUT PCB 18 open for connection of testing socket 94 and reception of the device under test 96 (DUT), as is further described herein.

Top plate 20 removably sits on top of DUT PCB 18, socket plate 16 and frame member 14. Top plate 20 is formed of any suitable size shape and design and is used for tightly and accurately holding DUT PCB 18 into contact with socket plate 16 and frame member 14 while also being quickly and easily removed from DUT PCB 18, socket plate 16 and frame member 14 so as to allow for quick and easy replacement of DUT PCB 18 to accommodate other DUTs 96. In the arrangement shown, top plate 20 includes a plurality of cam members 62 placed therein. Cam members 62 may be separate components connected to or installed into top plate 20, or cam members 62 may be formed directly into top plate 20 by machining or other the like processes.

More specifically, top plate 20 is generally planar in shape with a generally flat lower surface 64 and a generally flat top surface 66. In the arrangement shown, a cam member 62 is positioned approximately in each corner of top plate 20 so as to provide even and smooth downward force across top plate 20. Cam members 62, when viewed from above or below, have a generally cylindrical body 68 and include a generally cylindrical opening 70 positioned approximately at its middle that extends vertically through the cam member 62. At least one key slot opening 72 is connected to cylindrical opening 70. Key slot opening 72 is formed of any suitable size shape and design. In the arrangement shown, when viewed from above or below, key slot opening 72 is generally rectangular in shape and extends outward from or through the center of cylindrical opening 70.

Key slot opening 72 is positioned adjacent to a lower edge of cam surface 74. Cam surface 74 extends from key slot opening 72 and around cylindrical opening 70 as it extends at an angle toward upper surface 64 from lower surface 66. In one arrangement, the upper end of cam surface 74 terminates in a generally flat upper surface 74A or plateau which is positioned next to a stop surface 74B that defines the upper end of cam surface 74. That is, in the arrangement shown, each key slot opening 72 connects to the lower end of the sloped cam surface 74, with each key slot opening 72 being positioned on opposite sides of the cam member 62.

Cylindrical openings 70 and key slot openings 72 are sized and shaped to receive the upper ends of locking posts 24. That is, the upper end of locking posts 24 include keys or protrusions 76 that extend outward therefrom. In the arrangement shown, keys or protrusions 76 are cylindrical posts that extend outward in a generally perpendicular alignment to the length or height of locking posts 24 adjacent the upper end of locking posts 24. These posts are generally cylindrical in shape, however any other shape is hereby contemplated. In the arrangement shown, when viewed from the side, locking posts 24 with protrusions 76 have a T-shape. However any other shape is hereby contemplated for use.

Top plate 20 also includes a plurality of alignment openings 78 therein. These alignment openings 78 are sized and shaped to receive the upper end of alignment posts 26 therein in the same or similar manner that alignment openings 56 in DUT PCB 18 receive alignment posts 26.

When top plate 20 is placed on top of testing system 10, the alignment openings 78 of top plate are aligned with the alignment posts 26 of frame member 14 and the top plate 20 is lowered thereon. In this position, the cylindrical openings 70 and key slot openings 72 of cam members 62 are aligned with the upper ends of locking posts 24 when the locking posts 24 are in a disengaged position. As the top plate 20 is lowered, the upper ends of locking posts 26 pass through the cylindrical openings 70 in the cam members 62 and the keys or protrusions 76 pass through the key slot openings 72 in the cam members 62 until the top plate 20 is fully lowered in place with the lower surface of the top plate 20 in contact with the upper surface of DUT PCB 18. Once in this position, the locking posts 24 are rotated, this causes the keys or protrusions 76 to rotate out of the key slot openings 72 and to engage and slide upward along the cam surfaces 74. As the keys or protrusions 76 slide upward along cam surfaces 74, because the locking posts 24 are vertically fixed relative to the frame member 14, this pulls the top plate 20 into tighter and tighter engagement with the frame member 12 as the keys or protrusions 76 slide upward upon cam surfaces 74. This pulls the DUT PCB 18 into tighter and tighter engagement with the frame member 14, socket plate 16, and the compressible electrical contacts 49A of capsule s held within the socket openings 54. This continues until the protrusions 76 reach the flat upper surface 74A connected to the cam surface 74, and/or the protrusions 76 reach and engage the stop surface 74B. At this point the protrusions 76 can rest on the flat upper surface 74A. In one arrangement, so ensure that the protrusions do not unintentionally slide off of the flat upper surface 74A, a detent feature 74C is positioned at or near the upper end of the cam surface 74 or at or near the beginning of the flat upper surface 74A. This detent feature 74 requires the application of additional force to dislodge the protrusion from the flat upper surface 74A and thereby prevents unintentional disengagement thereof.

In one arrangement, the lower surface 64 of top plate 20 includes one or more compressible members 80 that extend downward therefrom. Compressible members 80 are formed of any compressible or resilient device such as a spring, a compressible piece of material, an air bag, an air chamber, a piston or the like. In the arrangement shown, compressible members 80 are springs and connect to floating plate 82 that directly engage the top surface of DUT PCB 18. The use of floating plate 82 and compressible members 80 ensure even pressure and constant and repeatable tightening force. In the arrangement shown, one floating plate 82 is positioned on either side of the center of system 10 and is sized and shaped to cover approximately the area where contact fields 58 of DUT PCB 18, capsules 49A, Electrical testing boards 49C, tester PCBs 49F, sockets 49G, and capsules 49A are located. The size, shape and location of floating plates 82 ensure that appropriate, even and constant downward pressure is generated between the compressible electrical contacts 49B of capsules 49A and the contact fields 58 of DUT PCB 18 thereby ensuring proper, constant and repeatable electrical connection there between.

In addition, to ensure repeatable tightening, and to prevent overtightening, a plurality of stop bars 84 extend upward from testing system 10, or in an alternative arrangement downward from top plate 20. Stop bars 84 are formed of any suitable size shape and design and define a stopping surface for top plate 20. In the arrangement shown, stop bars 84 are generally cylindrical in shape and terminate in a generally flat end which flatly and flushly engages top plate 20 thereby stopping the lower progression of top plate 20 relative to frame member 14.

Top plate 20 also includes a testing aperture 86 that is generally centrally located therein, or located at its approximate middle. In the arrangement shown, the rows of electrical testing boards 49C and capsules 49A are positioned on either side of the testing aperture 86. Testing aperture 86 is formed of any suitable size shape and design. In the arrangement shown, testing aperture 86 is generally square or rectangular in shape and separates top plate 20 into opposing sides 88. Testing aperture 86 provides access through top plate 20 and to the upper surface of center area 60 of DUT PCB 18 for testing purposes.

In one arrangement, a guide 89 (not shown) is connected to top plate 20 and positioned around testing aperture 86. Guide 89 is formed of any suitable size, shape and design. In one arrangement, guide 89 serves the purpose of conforming the testing aperture 86 to meet the size and shape of a handler device or other device that loads DUT 96 into testing system 10. In one arrangement, guide 89 also provides additional structural rigidity to the system 10. In one arrangement, guide 89 provides additional mounting capabilities for top plate 20.

DUT PCB 18 is formed of any suitable size shape and design. In the arrangement shown, DUT PCB 18 is generally square or rectangular in shape with its periphery being smaller or slightly smaller than the periphery of frame member 14 such that DUT PCB 18 fits within the exterior edge of frame member 14 when placed on top of frame member 14. DUT PCB 18 has a generally flat upper surface 90 that extends in approximate parallel spaced relation to a generally flat lower surface 92. DUT PCB 18 includes a plurality of contact fields 58 positioned in its lower surface 92 that electrically connect with compressible electrical contacts 49B of rigid capsules 49A held within socket openings 54. These contact fields 58 are aligned on both sides of center area 60 of DUT PCB 18.

A testing socket 94 is connected to the upper surface 90 of DUT PCB 18 and is sized and shaped to receive a device under test (DUT) 96, such as a semiconductor chip, a reference chip, or the like. Testing socket 94 is formed of any suitable size, shape and design and is generally sized and shaped specifically to receive DUT 96 within close and tight tolerances and in mating engagement with one another. In the arrangement shown, testing socket 94 includes a raised peripheral edge 98 which surrounds and provides a border to a field of contact pins 100 positioned approximately at the center of the testing socket 94.

Testing socket 94 is affixed to the upper surface 90 of DUT PCB 18 such that when DUT PCB 18 is placed on top of testing system 10, and top plate 20 is placed on top of DUT PCB 18, testing socket 94 is positioned within testing aperture 86 and is accessible from above testing system 10. Or, said another way, testing aperture 86 provides access to testing socket 94 which is positioned within the center area 60 of DUT PCB 18.

Testing socket 94 includes a plurality electrical contacts 100 positioned at its center within the a raised peripheral edge 98 of testing socket 94 which surrounds the electrical contacts 100. The electrical contact pins 100 of testing socket 94 electrically connect to electrical traces or leads that extend through DUT PCB 18 and electrically connect to the electrical contact fields 58 positioned in the lower surface 92 of DUT PCB 18. In this way, the DUT PCB serves to electrically connect the testing socket 94, and any DUT 96 positioned within the testing socket 94, connected to the top surface of the DUT PCB 18 to the electrical testing components 48 (capsules 49A, compressible electrical contacts 49B, electrical testing boards 49C, Tester PCBs 49*f*) positioned below the DUT PCB 18. As such, when DUT PCB 18 is placed on top of testing system 10, the electrical contact pins 100 of testing socket 94 electrically contact through DUT PCB 18 to the electrical testing components 48.

DUT 96 is often a sophisticated semiconductor chip that provides sophisticated functionality and capabilities in a tremendously compact size. As such, DUT 96 often has a very high density of electrical contacts in its lower surface that electrically connect the DUT 96 to the device DUT 96 is installed in (such a computer's motherboard, or the like).

Accordingly, to test all of the contacts DUT 96 has in its lower surface, electrical testing socket 94 has a corresponding number of electrical contacts or pins 100 in its upper surface. Testing system 10 is configured to perform complex and sophisticated testing procedures on DUT 96 which require sophisticated and complex electrical testing components 48 (as are described herein). DUT PCB 18 serves to connect the dense electrical contacts in the bottom surface of DUT 96 (the electrical contact pins 100 in the upper surface of testing socket 94) to the electrical testing components 48 of the system 10 through a network of electrical traces embedded within the DUT PCB 18. As such, through its network of internal electrical leads (or traces) DUT PCB 18 expands the dense electrical leads in the bottom surface of DUT 96 outward and to the sides of DUT PCB 18 so as to provide room for the electrical testing components 48 needed to perform the electrical tests to ensure DUT 96 is a conforming device and within spec. As such, through its network or electrical traces, DUT PCB 18 serves to expanded surface area of the electrical contacts 100 in testing socket 94 outward so as to provide room for the needed electrical testing components 48 of system 10. While system 10 houses the electrical testing components 48 in a very dense arrangement, the surface area required for the electrical testing components 48 is substantially greater than the surface area of the electrical contacts in the DUT 96.

Locking posts 24 are formed of any suitable size, shape and design. In the arrangement shown, locking posts 24 extend vertically through frame member 14 with the lower ends protruding outward from the bottom plate 12 and the upper ends protruding outward from the socket plate 16. In the arrangement shown, a locking post 24 is positioned approximately in each corner of the testing system 10 so as to provide even tightening of top plate 20. The lower ends of locking posts 24 connect to a rotatable member 110 having a pair of posts 112 extending downward therefrom, each post 112 being off center from the axis of rotation 114 of locking post 24.

Each post 112 is connected to a linkage 116. Linkages 116 mechanically link the rotatable member 110 to the adjacent rotatable members 110 and thereby mechanically connect all locking posts 24 to one another. In this way, when one rotatable member 110/locking post 24 moves, so moves all other rotatable members 110/locking posts 24. Linkages 116 are formed of any suitable size, shape and design. In the arrangement shown, linkages 116 are generally elongated bars that terminate in threaded heads 118 having openings with bearing surfaces that rotatably connect to posts 112. In this way linkages 116 are lengthwise adjustable, using the threaded ends, and allow for rotation of posts within heads 118.

At least one rotatable member 110 includes an arm 120 that extends outward therefrom and rotatably connects to actuating mechanism 22. Actuating mechanism 22 is formed of any device that actuates or causes rotation of locking posts 24. In the arrangement shown, actuating mechanism 22 is an electrical, pneumatic or hydraulic device, such as a solenoid, a piston, a cylinder, or the like that moves arm 120 between an engaged position, which locks top plate 20 in place, and a disengaged position, which allows top plate to be removed and replaced. In the arrangement shown, actuating mechanism 22 is connected to the exterior lower edge of frame member 14. In an alternative arrangement, actuating mechanism 22 is a manual device, such as a bar or lever that extends outward from the exterior lower edge of frame member 14. Arm 120 rotatably connects to actuating mechanism at an axis of rotation 122 that allows rotation of arm 120 relative to actuating mechanism 22 as actuating mechanism 22 moves.

To provide proper clearance for movement of locking posts 24, rotatable members 110, posts 112, linkages 116, threaded heads 118 and arm 120, these components reside within recesses 122 grooves, or deviations in the bottom plane or bottom surface or bottom plate 120 of system 10 that provide clearance for these components and allow for their unencumbered movement.

Due to the high density of the electrical testing components 48 positioned within the hollow interior of frame member 14, the testing system 10 generates a great amount of heat. To combat this heat generation, fan members 126 are connected to the end walls 36 and/or sidewalls 28 which pull or push air movement through the hollow interior of frame member 14 thereby cooling the electrical testing components 48 and preventing the system from overheating. Fan members 126 are formed of any suitable air moving device and fluidly connect to openings 127 or passageways in the end walls 36 and/or sidewalls 28 of frame member 14 that maximize the amount of air that can flow through end walls 36 and/or sidewalls 28.

In arrangements where a handler, machine, robot, or other device is placing DUT 96 into testing socket 94, it may be necessary to provide additional structural rigidity to DUT PCB 18 so as to prevent flexing or breakage of DUT PCB 18. In some arrangements, the addition of a sprite stiffener 130 is beneficial. In these arrangements, sprite stiffener 130 is any device which is attached to the lower surface 92 of DUT PCB 18 below the testing socket 94. Sprite stiffener 130 is formed of any rigid component and is connected to DUT PCB 18 in any manner known in the art such as passing threaded fasteners through DUT PCB 18 and sprite stiffener 130, using adhesives, or the like. In the arrangement shown, sprite stiffener 130 is generally square or rectangular in shape and fits within the testing aperture 86 of top plate 20.

To provide further structural rigidity, a pedestal support 132 can be placed within the hollow interior 27 of frame member 14 and below the testing socket 94. Pedestal support 132 is any device which provides structural support to the lower side of DUT PCB 18. In one arrangement, as is shown, pedestal support 132 is an adjustable device which resides within the hollow interior 27 of frame member 14 and sits upon the upper surface of the bottom plate 12 and includes a pad 134 that engages the lower surface 92 of DUT PCB 18. In the arrangement shown, pedestal support 132 has, at its bottom end, a generally flat bottom surface 136 that flatly and flushly connects to the upper surface of bottom plate 12. Similarly, in the arrangement shown, at its upper end pedestal support 132 has a pad 134 that has a generally flat upper surface that flatly and flushly connects to the lower surface 92 of DUT PCB 18, sprite stiffener 130 or any other component that provides support to the bottom side of DUT PCB 18. An adjustment mechanism 138 is positioned between the bottom surface 136 and pad 134 that adjusts the height of pad 134 so as to provide optimal support to DUT PCB 18 and prevent flexing caused by the insertion of DUT 96 by a robot or machine. Adjust mechanism 138 is any device or arrangement that allows for vertical adjustment such as a threaded collar over a threaded shaft, a gearing arrangement or the like.

In Operation: To assemble the testing system 10, a DUT PCB 18 is selected for the particular DUT 96 that is being manufactured and therefore needs to be tested. Once selected, the DUT PCB 18 is placed on top of the testing system 10 and on top of socket plates 16. When placing the DUT PCB 18 on top of the socket plate 16, care is taken to ensure that the alignment posts 26 of testing system 10 align with and are received within the alignment openings 56 of DUT PCB 18. Once aligned in this manner, DUT PCB 18 is lowered until the lower surface 92 of DUT PCB 18 engages the upper surface 50 of socket plate 16. In this position, the contact fields 58 of DUT PCB 18 physically engage the compressible electrical contacts 49B of the capsules 49A held within the socket openings 54 of socket plates 16. In this way, the DUT PCB 18 is electrically connected to the electrical testing boards 49C of electrical testing components 48.

Once in this position, top plate 20 is placed on top of DUT PCB 18. This is accomplished by aligning the alignment openings 78 in top plate 20 with the upper end of alignment posts 26. Once in this position, top plate 20 is lowered onto testing system 10 until the lower surface of floating plate 82 engages the upper surface 90 of DUT PCB 18 or until the top plate 20 engages the upper end of the stop bars 84.

As the top plate 20 is aligned with the alignment posts 26, the locking posts 24 are simultaneously aligned with the cam members 62. More specifically when the locking posts 24 are in a disengaged position, the locking posts 24 are aligned with the cylindrical openings 70 in the cam members 62 and the keys or protrusions 76 attached to the locking posts 24 are aligned with the key slot openings 72 in the cam members 62.

Once in this position, the top plate is lowered in place. Once fully lowered, the actuating mechanism 22 is actuated, either by manual movement or by motorized movement. As the actuating mechanism 22 is moved, the rotatable member 110 that arm 120 directly connects to rotates thereby causing all other rotatable members 110 to similarly rotate. This rotation of rotatable member 110 simultaneously and evenly causes the rotation of the other rotatable members 110 by transferring this rotational movement through the arrangement of posts 112, through linkages 116 and into the other rotatable members 110.

As the rotatable members 110 rotate, so rotates the locking posts 24. As the locking posts 24 rotate out of their disengaged position, the keys or protrusions 76 rotate out of the key slot openings 72. As the keys or protrusions 76 rotate out of the key slot openings 72 the keys or protrusions 67 engage the angled or sloping cam surface 74 of cam members 62. As the locking posts 24 continue to rotate this causes the keys or protrusions 76 to slide over the cam surfaces 74 which has the effect of pulling the top plate 20 closer to and into tighter engagement with testing system 10. This progression continues until the locking posts 24 are fully rotated and the keys or protrusions 76 reach a plateau or level portion 74A at the end of the cam surface 74, and/or the keys or protrusions 76 engage the stop surface 74B at the end of the cam surface 74, at which point the top plate 20 is fully engaged and tightened against testing system 10 and the testing system 10 is ready for testing. As the top plate 20 is pulled lower the compressible members 80 vertically compress thereby applying pressure to force the DUT PCB 18 towards the frame member 14.

Once the system 10 is assembled, with the DUT PCB 18 and top plate 20 installed, to use the testing system 10, a DUT 96 is then placed in the testing socket 94 such that the edges of the DUT 96 are aligned with the raised peripheral edge 98 of the testing socket 94 and the contact pins 100 in the upper surface of the testing socket 94 receive, engage and electrically connect to the electrical contacts of the DUT 96. Once in this position, electrical signals are transmitted through the electrical testing components 48 and through the DUT 96.

More specifically, the electrical testing boards 49C send and receive electrical signals through the edge connectors of sockets 49G. These signals then transmit through the electrical leads of tester PCB 49F and into the capsules 49A. More specifically, the electrical signals pass through the compressible electrical contacts 49B of capsules 49A and into the contact fields 58 of DUT PCB 18. These electrical signals travel through the DUT PCB 18 and into the testing socket 94. These electrical signals then pass through the testing socket 94 and into the DUT 96. These electrical signals travel through the DUT 96 and back to the electrical testing boards 49C through the same or a similar path; and the process repeats. The electric testing components 48 measure these signals and determine whether the DUT 96 is conforming or non-conforming.

Once the test is complete, the DUT 96 is removed and another DUT 96 is inserted into the testing socket 94 and the process is repeated.

This process is repeated until another type or style of DUT 96 needs to be tested at which point the DUT PCB 18 is removed using the opposite process described above. That is, the actuating mechanism 22 is rotated in an opposite direction until the keys or protrusions 76 are in a disengaged position from the cam members 62. Once disengaged, the top plate 20 is removed and the DUT PCB 18 is removed. Next, a new DUT PCB 18 that includes a testing socket 94 configured specifically for the new DUT 96 to be tested is selected and the above-described process is repeated for installing the new DUT PCB 18 and testing the new DUT 96.

Rectangular and Square Arrangements: It is to be noted, that while a single rectangular testing device 10 is presented in the drawings having one or more rows of electrical testing boards 49C aligned on two, opposing, sides of the testing system 10, it is hereby contemplated that a square or cross shaped testing system may be utilized having four rows of electrical testing boards 49C, one row on each of the squared sides of testing aperture 86/center area 60 of DUT PCB 18. This arrangement allows for the use of additional electrical testing boards 49C. Also, another Double Wide: It is also to be noted, that the teachings herein apply to a wider version of the device shown in the drawings. That is, the depth of the device can be increased any amount to accommodate any number of electrical testing boards 49C and/or multiple testing sockets 94 and/or any sized or shaped DUT 96.

From the above discussion it will be appreciated that a quick change small footprint testing system and method of use is presented that improves upon the state of the art.

Specifically, the quick change small footprint testing system and method of use is presented: quickly converts between configurations for testing different semiconductor chips; easily converts between configurations for testing different semiconductor chips; is easy to use; provides accurate testing for semiconductor chips; can be used with a wide variety of semiconductor chips; is inexpensive; long useful life; has a small footprint; minimizes the amount of space required to test a variety of semiconductor chips; minimizes the capital cost for testing equipment for testing a variety of semiconductor chips; provides for quick removal of and replacement of DUT PCBs having testing sockets thereon; is high quality; and is durable, among countless other advantages and improvements.

It will be appreciated by those skilled in the art that other various modifications could be made to the device without parting from the spirit and scope of this invention. All such modifications and changes fall within the scope of the claims and are intended to be covered thereby.

What is claimed:
1. A semiconductor testing system, comprising:
a frame member;
the frame member extending a length from a first side to a second side;
the frame member extending a depth from first end to a second end;
the frame member extending a height from a lower end to an upper end;
the frame member defining a hollow interior;
a plurality of locking posts operably connected to the frame member;
wherein the plurality of locking posts are configured to rotate between a disengaged position and an engaged position;
a device under test printed circuit board (DUT PCB);
the DUT PCB having an upper surface and a lower surface;
a testing socket connected to the upper surface of the DUT PCB;
a plurality of electrical contacts positioned in the lower surface of the DUT PCB;
a top plate;
the top plate having a plurality of cam members;
wherein the plurality of cam members are configured to receive the plurality of locking posts;
the cam members having a cam surface;
a plurality of electrical testing boards housed within the hollow interior of the frame member;
the plurality of electrical testing boards positioned in vertical alignment within the hollow interior of the frame member;
wherein when the DUT PCB is placed on top of the frame member and the top plate, and the locking posts are rotated from a disengaged position to an engaged position, electrical contact is made between the DUT PCB and the plurality of electrical testing boards.

2. The system of claim 1, wherein the frame is approximately square or rectangular in shape when viewed from above or below and a locking post is positioned adjacent each corner.

3. The system of claim 1, wherein an upper end of the locking posts include at least one protrusion that fits within a key slot opening of the cam members.

4. The system of claim 1, further comprising at least one floating plate connected to a bottom surface of the top plate by at least one compressible member.

5. The system of claim 1, wherein when a device under test (DUT) is placed in the testing socket, the electrical testing boards perform electronic tests on the DUT.

6. The system of claim 1, wherein the plurality of electrical testing boards are aligned in rows within the hollow interior of the frame, with one row of electrical testing boards positioned adjacent a first side of the frame member and a second row of electrical testing boards position adjacent a second side of the frame member so as to maximize density while minimizing space requirements.

7. A semiconductor testing system, the system comprising:
a frame member;
the frame member defining a hollow interior;
a plurality of electrical testing boards housed within the hollow interior of the frame member;
a plurality of locking posts operably connected to the frame member;
the plurality of locking posts configured to rotate between a disengaged position and an engaged position;
a device under test printed circuit board (DUT PCB) removably placed on top of the frame member;
the DUT PCB having a generally planar shape having an upper surface and a lower surface;
the DUT PCB having a plurality of electrical contacts positioned in its lower surface;
a top plate removably placed on top of the frame member and DUT PCB;
the top plate having a plurality of cam members,
the plurality of cam members having at least one cam surface;
wherein the plurality of cam members are configured to receive the locking posts of the frame member;
wherein when the top plate is placed on top of the PCB DUT and the frame member and the locking posts are rotated from a disengaged position to an engaged position, the interaction of the plurality of locking posts with the plurality of cam members causes the plurality of electrical contacts to operably electrically connect with the plurality of electrical testing boards.

8. The system of claim 7, wherein the plurality of electrical testing boards are vertically aligned and positioned in approximate parallel spaced relation with one another within the hollow interior of the frame member so as to maximize density while minimizing space requirements.

9. The system of claim 7, wherein the plurality of electrical testing boards are vertically aligned in rows within the hollow interior of the frame, with one row of electrical testing boards positioned adjacent a first side of the frame member and a second row of electrical testing boards position adjacent a second side of the frame member, wherein the second side is opposite the first side.

10. The system of claim 7, wherein the plurality of electrical testing boards are vertically aligned in rows along a first side and a second side of the frame member.

11. The system of claim 7, wherein the plurality of electrical testing boards connect at an upper end to edge connectors, wherein the plurality of electrical testing boards hang downward from their upper end.

12. The system of claim 7, wherein the plurality of electrical contacts in the lower surface of the DUT PCB connect to compressible electrical contacts in capsules operably held by the frame member, wherein the capsules electrically connect to the electrical testing boards.

13. The system of claim 7 further comprising a plurality of capsules operably held by the frame member, the capsules having a plurality of compressible electrical contacts, wherein the compressible electrical contacts in the capsules are configured to contact the electrical contacts positioned in the lower surface of the DUT PCB.

14. The system of claim 7, further comprising at least one floating plate connected to a bottom surface of the top plate by at least one compressible member.

15. A semiconductor testing system, the system comprising:
a frame member;
the frame member defining a hollow interior;
at least one socket plate connected to the frame member,
the at least one socket plate housing a plurality of capsules, the capsules having a plurality of compressible electrical contacts extending upward from the capsules;

a plurality of electrical testing boards housed within the hollow interior of the frame member;

the plurality of electrical testing boards electrically connected to the plurality of capsules;

a plurality of locking posts operably connected to the frame member;

the plurality of locking posts configured to rotate between a disengaged position and an engaged position;

a device under test printed circuit board (DUT PCB) removably placed on top of the frame member;

the DUT PCB having a generally planar shape having an upper surface and a lower surface;

the DUT PCB having a plurality of electrical contacts positioned in its lower surface;

a top plate removably placed on top of the frame member and DUT PCB;

the top plate having a plurality of cam members, the plurality of cam members having at least one cam surface;

wherein the plurality of cam members are configured to receive the locking posts of the frame member;

wherein when the top plate is placed on top of the PCB DUT and the frame member, and the locking posts are rotated from a disengaged position to an engaged position, the plurality of electrical contacts in the bottom surface of the DUT PCB are pulled into electrical contact with the compressible electrical contacts of the capsules.

16. The system of claim 15, wherein each capsule operably holds two electrical testing boards.

17. The system of claim 15, wherein the plurality of electrical testing boards are vertically aligned in rows, with a first row aligned along a first side and a second row aligned along a second side, the first side opposite the second side.

18. The device of claim 15, wherein an upper end of the locking posts include at least one protrusion that fits within a key slot opening of the cam members.

19. The device of claim 15, wherein the frame member includes a pair of socket plates, with one socket plate positioned on opposing sides of the frame member.

20. The system of claim 15, further comprising at least one floating plate connected to a bottom surface of the top plate by at least one compressible member.

* * * * *

UNITED STATES PATENT AND TRADEMARK OFFICE
CERTIFICATE OF CORRECTION

PATENT NO. : 9,885,737 B2
APPLICATION NO. : 14/996045
DATED : February 6, 2018
INVENTOR(S) : Lynwood Adams and Jack Lewis It is certified that error appears in the above-identified patent and that said Letters Patent is hereby corrected as shown below:

In the Claims

In Column 15, beginning with Line 8, Claim 1 should read as follows:
1. A semiconductor testing system, comprising:
a frame member;
the frame member extending a length from a first side to a second side;
the frame member extending a depth from first end to a second end;
the frame member extending a height from a lower end to an upper end;
the frame member defining a hollow interior;
a plurality of locking posts operably connected to the frame member;
wherein the plurality of locking posts are configured to rotate between a disengaged position and an engaged position;
a device under test printed circuit board (DUT PCB);
the DUT PCB having an upper surface and a lower surface;
a testing socket connected to the upper surface of the DUT PCB;
a plurality of electrical contacts positioned in the lower surface of the DUT PCB;
a top plate;
the top plate having a plurality of cam members;
wherein the plurality of cam members are configured to receive the plurality of locking posts;
the cam members having a cam surface;
a plurality of electrical testing boards housed within the hollow interior of the frame member;
the plurality of electrical testing boards positioned in vertical alignment within the hollow interior of the frame member;
wherein when the DUT PCB is placed on top of the frame member and the top plate is placed on top of the DUT PCB, and the locking posts are rotated from a disengaged position to an engaged position, electrical contact is made between the DUT PCB and the plurality of electrical testing boards.

Signed and Sealed this
Twentieth Day of March, 2018

Andrei Iancu
*Director of the United States Patent and Trademark Office*

CERTIFICATE OF CORRECTION (continued)

In Column 15, beginning on Line 44, please amend Claim 2 to read as follows:
2. The system of claim 1, wherein the frame member is approximately square or rectangular in shape when viewed from above or below and a locking post is positioned adjacent each corner.

In Column 15, beginning on Line 57, please amend Claim 6 to read as follows:
6. The system of claim 1, wherein the plurality of electrical testing boards are aligned in rows within the hollow interior of the frame member, with one row of electrical testing boards positioned adjacent a first side of the frame member and a second row of electrical testing boards position adjacent a second side of the frame member so as to maximize density while minimizing space requirements.

In Column 15, beginning on Line 64, please amend Claim 7 to read as follows:
7. A semiconductor testing system, the system comprising:
a frame member;
the frame member defining a hollow interior;
a plurality of electrical testing boards housed within the hollow interior of the frame member;
a plurality of locking posts operably connected to the frame member;
the plurality of locking posts configured to rotate between a disengaged position and an engaged position;
a device under test printed circuit board (DUT PCB) removably placed on top of the frame member;
the DUT PCB having a generally planar shape having an upper surface and a lower surface;
the DUT PCB having a plurality of electrical contacts positioned in its lower surface;
a top plate removably placed on top of the frame member and DUT PCB;
the top plate having a plurality of cam members, the plurality of cam members having at least one cam surface;
wherein the plurality of cam members are configured to receive the locking posts of the frame member;
wherein when the top plate is placed on top of the DUT PCB and the frame member and the locking posts are rotated from a disengaged position to an engaged position, the interaction of the plurality of locking posts with the plurality of cam members causes the plurality of electrical contacts to operably electrically connect with the plurality of electrical testing boards.

In Column 16, beginning on Line 32, please amend Claim 9 to read as follows:
9. The system of claim 7, wherein the plurality of electrical testing boards are vertically aligned in rows within the hollow interior of the frame member, with one row of electrical testing boards positioned adjacent a first side of the frame member and a second row of electrical testing boards position adjacent a second side of the frame member, wherein the second side is opposite the first side.

In Column 16, beginning on Line 60, please amend Claim 15 to read as follows:
15. A semiconductor testing system, the system comprising:
a frame member;
the frame member defining a hollow interior;
at least one socket plate connected to the frame member, the at least one socket plate housing a plurality of capsules, the capsules having a plurality of compressible electrical contacts extending upward from the capsules;

a plurality of electrical testing boards housed within the hollow interior of the frame member;
the plurality of electrical testing boards electrically connected to the plurality of capsules;
a plurality of locking posts operably connected to the frame member;
the plurality of locking posts configured to rotate between a disengaged position and an engaged position;
a device under test printed circuit board (DUT PCB) removably placed on top of the frame member;
the DUT PCB having a generally planar shape having an upper surface and a lower surface;
the DUT PCB having a plurality of electrical contacts positioned in its lower surface;
a top plate removably placed on top of the frame member and DUT PCB;
the top plate having a plurality of cam members, the plurality of cam members having at least one cam surface;
wherein the plurality of cam members are configured to receive the locking posts of the frame member;
wherein when the top plate is placed on top of the DUT PCB and the frame member, and the locking posts are rotated from a disengaged position to an engaged position, the plurality of electrical contacts in the bottom surface of the DUT PCB are pulled into electrical contact with the compressible electrical contacts of the capsules.